(12) United States Patent
Zohni

(10) Patent No.: US 8,970,028 B2
(45) Date of Patent: Mar. 3, 2015

(54) EMBEDDED HEAT SPREADER FOR PACKAGE WITH MULTIPLE MICROELECTRONIC ELEMENTS AND FACE-DOWN CONNECTION

(75) Inventor: Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/339,595

(22) Filed: Dec. 29, 2011

(65) Prior Publication Data
US 2013/0168843 A1 Jul. 4, 2013

(51) Int. Cl.
*H01L 23/34* (2006.01)
(52) U.S. Cl.
USPC ........... 257/713; 257/686; 257/707; 257/712; 257/777; 257/787; 257/E23.087
(58) Field of Classification Search
USPC ................. 257/686, 777, 707, 712, 713, 787, 257/E23.087
See application file for complete search history.

(56) References Cited

U.S. PATENT DOCUMENTS

| | | |
|---|---|---|
| 4,941,033 A | 7/1990 | Kishida |
| 5,148,265 A | 9/1992 | Khandros et al. |
| 5,148,266 A | 9/1992 | Khandros et al. |
| 5,347,159 A | 9/1994 | Khandros et al. |
| 5,480,840 A | 1/1996 | Barnes et al. |
| 5,679,977 A | 10/1997 | Khandros et al. |
| 5,861,666 A | 1/1999 | Bellaar |
| 5,977,640 A | 11/1999 | Bertin et al. |
| 5,998,864 A | 12/1999 | Khandros et al. |
| 6,021,048 A | 2/2000 | Smith |
| 6,150,724 A | 11/2000 | Wenzel et al. |
| 6,199,743 B1 | 3/2001 | Bettinger et al. |
| 6,218,728 B1 | 4/2001 | Kimura |
| 6,218,731 B1 * | 4/2001 | Huang et al. .................. 257/738 |
| 6,353,539 B1 | 3/2002 | Horine et al. |
| 6,369,448 B1 | 4/2002 | McCormick |
| 6,385,049 B1 | 5/2002 | Chia-Yu et al. |
| 6,392,292 B1 | 5/2002 | Morishita |

(Continued)

FOREIGN PATENT DOCUMENTS

| | | |
|---|---|---|
| CN | 101055840 A | 10/2007 |
| JP | 62107391 | 5/1987 |

(Continued)

OTHER PUBLICATIONS

Inernational Search Report and Written Opinion for Application No. PCT/US2012/071630 dated Apr. 4, 2013.

(Continued)

*Primary Examiner* — Colleen A Matthews
*Assistant Examiner* — William Harriston
(74) *Attorney, Agent, or Firm* — Lerner, David, Littenberg, Krumholz & Mentlik, LLP

(57) ABSTRACT

A microelectronic package includes a substrate, first and second microelectronic elements, and a heat spreader. The substrate has terminals thereon configured for electrical connection with a component external to the package. The first microelectronic element is adjacent the substrate and the second microelectronic element is at least partially overlying the first microelectronic element. The heat spreader is sheet-like, separates the first and second microelectronic elements, and includes an aperture. Connections extend through the aperture and electrically couple the second microelectronic element with the substrate.

50 Claims, 23 Drawing Sheets

(56) References Cited

U.S. PATENT DOCUMENTS

| | | |
|---|---|---|
| 6,414,396 B1 | 7/2002 | Shim et al. |
| 6,445,594 B1 | 9/2002 | Nakagawa et al. |
| 6,472,741 B1* | 10/2002 | Chen et al. .................... 257/712 |
| 6,492,726 B1 | 12/2002 | Quek et al. |
| 6,583,502 B2 | 6/2003 | Lee et al. |
| 6,703,713 B1 | 3/2004 | Tseng et al. |
| 6,720,666 B2 | 4/2004 | Lim et al. |
| 6,731,009 B1 | 5/2004 | Jones et al. |
| 6,734,542 B2 | 5/2004 | Nakatani et al. |
| 6,742,098 B1 | 5/2004 | Halbert et al. |
| 6,762,942 B1 | 7/2004 | Smith |
| 6,793,116 B2 | 9/2004 | Harada |
| 6,811,580 B1 | 11/2004 | Littecke |
| 6,818,474 B2 | 11/2004 | Kim et al. |
| 6,977,440 B2 | 12/2005 | Pflughaupt et al. |
| 7,061,105 B2 | 6/2006 | Masuda et al. |
| 7,061,121 B2 | 6/2006 | Haba |
| 7,095,104 B2 | 8/2006 | Blackshear |
| 7,205,656 B2 | 4/2007 | Kim et al. |
| 7,389,937 B2 | 6/2008 | Ito |
| 7,462,936 B2 | 12/2008 | Haba et al. |
| 7,504,284 B2 | 3/2009 | Ye et al. |
| 7,633,146 B2 | 12/2009 | Masuda et al. |
| 7,638,868 B2 | 12/2009 | Haba |
| 7,855,462 B2 | 12/2010 | Boon et al. |
| 7,880,310 B2 | 2/2011 | Mathew |
| 7,892,889 B2 | 2/2011 | Howard et al. |
| 7,969,006 B2 | 6/2011 | Lin et al. |
| 8,026,589 B1 | 9/2011 | Kim et al. |
| 8,254,155 B1 | 8/2012 | Crisp et al. |
| 8,304,881 B1 | 11/2012 | Haba et al. |
| 8,378,478 B2 | 2/2013 | Desai et al. |
| 2001/0005311 A1 | 6/2001 | Duesman et al. |
| 2002/0030267 A1 | 3/2002 | Suzuki |
| 2002/0053727 A1 | 5/2002 | Kimura |
| 2002/0175421 A1 | 11/2002 | Kimura |
| 2003/0064547 A1 | 4/2003 | Akram et al. |
| 2003/0116349 A1 | 6/2003 | Hashimoto |
| 2003/0179549 A1 | 9/2003 | Zhong et al. |
| 2003/0183917 A1 | 10/2003 | Tsai et al. |
| 2003/0193788 A1 | 10/2003 | Farnworth et al. |
| 2004/0016999 A1 | 1/2004 | Misumi |
| 2004/0124520 A1 | 7/2004 | Rinne |
| 2004/0184240 A1 | 9/2004 | Su |
| 2004/0262774 A1 | 12/2004 | Kang et al. |
| 2005/0110125 A1 | 5/2005 | Blackshear |
| 2005/0110162 A1 | 5/2005 | Meyer-Berg et al. |
| 2005/0116326 A1 | 6/2005 | Haba et al. |
| 2005/0116358 A1* | 6/2005 | Haba ............................ 257/789 |
| 2005/0133932 A1 | 6/2005 | Pohl et al. |
| 2005/0164486 A1 | 7/2005 | Lua et al. |
| 2005/0173807 A1 | 8/2005 | Zhu et al. |
| 2005/0218514 A1 | 10/2005 | Massingill |
| 2005/0258538 A1 | 11/2005 | Gerber |
| 2006/0006405 A1 | 1/2006 | Mazzochette |
| 2006/0027902 A1 | 2/2006 | Ararao et al. |
| 2006/0081583 A1 | 4/2006 | Hembree et al. |
| 2006/0097379 A1 | 5/2006 | Wang |
| 2006/0097400 A1 | 5/2006 | Cruz et al. |
| 2006/0113653 A1 | 6/2006 | Xiaoqi et al. |
| 2006/0145323 A1 | 7/2006 | Lee |
| 2006/0231938 A1 | 10/2006 | Mangrum |
| 2006/0249827 A1 | 11/2006 | Fasano et al. |
| 2006/0290005 A1 | 12/2006 | Thomas et al. |
| 2007/0075409 A1 | 4/2007 | Letterman et al. |
| 2007/0108592 A1 | 5/2007 | Lai et al. |
| 2007/0120238 A1 | 5/2007 | Vaiyapuri |
| 2007/0152310 A1 | 7/2007 | Osborn et al. |
| 2007/0160817 A1 | 7/2007 | Roh |
| 2007/0164407 A1 | 7/2007 | Jun et al. |
| 2007/0176297 A1 | 8/2007 | Zohni |
| 2007/0176298 A1 | 8/2007 | Osone et al. |
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1 | 1/2008 | Howard et al. |
| 2008/0036067 A1 | 2/2008 | Lin |
| 2008/0042249 A1 | 2/2008 | Haba |
| 2008/0048777 A1 | 2/2008 | Kohjiro et al. |
| 2008/0073777 A1 | 3/2008 | Cui et al. |
| 2008/0093725 A1 | 4/2008 | Jung et al. |
| 2008/0122067 A1 | 5/2008 | Wang |
| 2008/0136006 A1 | 6/2008 | Jang et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0168366 A1 | 7/2009 | Clayton et al. |
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0244278 A1 | 9/2010 | Shen |
| 2010/0258928 A1 | 10/2010 | Chi et al. |
| 2010/0295166 A1 | 11/2010 | Kim |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2011/0193582 A1 | 8/2011 | Cho |
| 2012/0091574 A1 | 4/2012 | Lin et al. |
| 2012/0092832 A1 | 4/2012 | Haba et al. |
| 2012/0126389 A1 | 5/2012 | Desai et al. |
| 2012/0153435 A1 | 6/2012 | Haba et al. |
| 2012/0267796 A1 | 10/2012 | Haba et al. |
| 2012/0267798 A1 | 10/2012 | Haba et al. |
| 2013/0082394 A1 | 4/2013 | Crisp et al. |
| 2013/0099387 A1 | 4/2013 | Caskey et al. |
| 2013/0249116 A1 | 9/2013 | Mohammed et al. |
| 2014/0035121 A1 | 2/2014 | Haba et al. |

FOREIGN PATENT DOCUMENTS

| | | |
|---|---|---|
| JP | 2001196407 A | 7/2001 |
| JP | 2002-076252 A | 3/2002 |
| JP | 2004-063767 A | 2/2004 |
| JP | 2005251957 A | 9/2005 |
| JP | 2006079629 A | 3/2006 |
| JP | 2008-198841 A | 8/2008 |
| JP | 2010-098098 A | 4/2010 |
| KR | 2001-0002214 A | 1/2001 |
| KR | 20010081922 A | 8/2001 |
| KR | 2001-0094894 A | 11/2001 |
| KR | 10-0382035 B1 | 5/2003 |
| KR | 10-0393095 B1 | 7/2003 |
| KR | 2005-0119414 A | 12/2005 |
| KR | 2006-0120365 A | 11/2006 |
| KR | 10-0690247 B1 | 2/2007 |
| KR | 1020060004298 | 3/2007 |
| KR | 2007-0088177 A | 8/2007 |
| KR | 2009-0008341 A | 1/2009 |
| KR | 2009-0086314 A | 8/2009 |

(56) References Cited

FOREIGN PATENT DOCUMENTS

| KR | 2010-0041430 | A  | 4/2010 |
|----|--------------|----|--------|
| KR | 101011863    | B1 | 1/2011 |
| KR | 101061531    | B1 | 9/2011 |
| TW | I313049      | B  | 8/2009 |
| WO | 2007088757   | A1 | 8/2007 |

OTHER PUBLICATIONS

International Search Report for Application No. PCT/US2011/056352 dated Apr. 5, 2012.
U.S. Appl. No. 61/477,877, filed Apr. 21, 2011.
European Examination Report for Application No. 11776969.5 dated Jun. 27, 2014.
International Preliminary Report on Patentability for Application No. PCT/US2011/056352 dated Apr. 23, 2013.
Second Written Opinion for Application No. PCt/US2013/053240 dated Jul. 29, 2014.
Asinash Roy et al: "Effects of Coupling Capacitance and Inductance on Delay Uncertainty and Clock Skew" , 2007 44th ACM/IEEE Design Automation Conference , San Diego, CA, Jun. 4-8, 2007, IEEE, PI Scataway, NJ , Jun. 1, 2007, pp. 184-187, XP031183328.
International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2013/053240 dated Sep. 16, 2013.
International Search Report and Written Opinion for Application No. PCT/US2013/065605 dated Feb. 21, 2014.
International Search Report and Written Opinion for PCT/US2012/034196 dated Jun. 4, 2012.
International Search Report Application No. PCT/US2011/031391, dated Dec. 12, 2011.
Korean Application No. 10-2011-041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Partial Search Report for Application No. PCT/US2013/065605 dated Nov. 28, 2013.
Search Report from Korean Patent Application No. 10-2010-0129888 dated Jan. 18, 2011.
Search Report from Korean Patent Application No. 10-2010-0129890 dated Jan. 18, 2011.
Taiwanese Office Action for Application No. 101112514 dated Mar. 13, 2014.
Written Opinion of the International Preliminary Examining Authority dated Apr. 16, 2013 for Application No. PCT/US2012/029876.
Taiwanese Office Action for Application No. 101112511 dated Sep. 30, 2014.

* cited by examiner

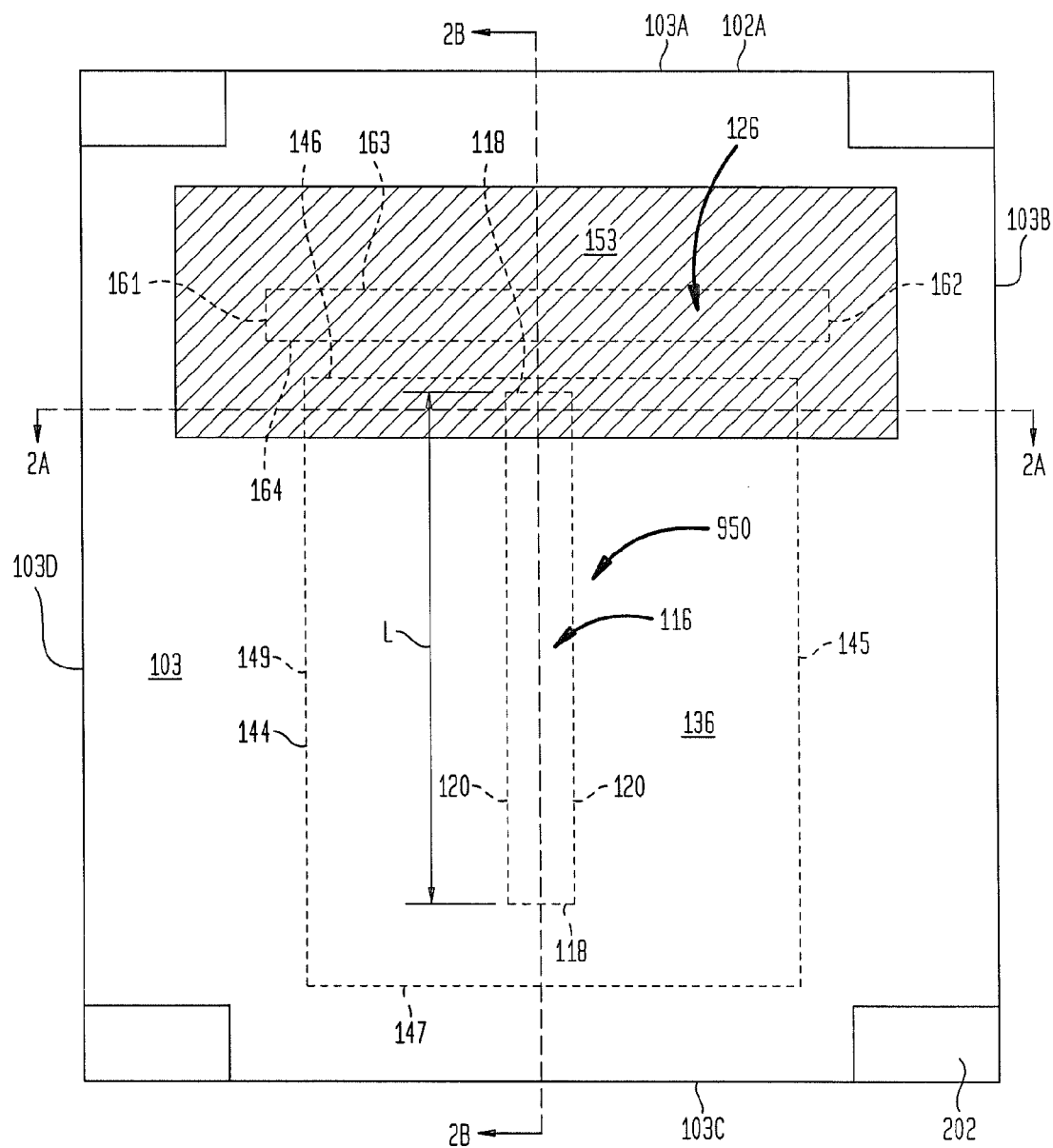

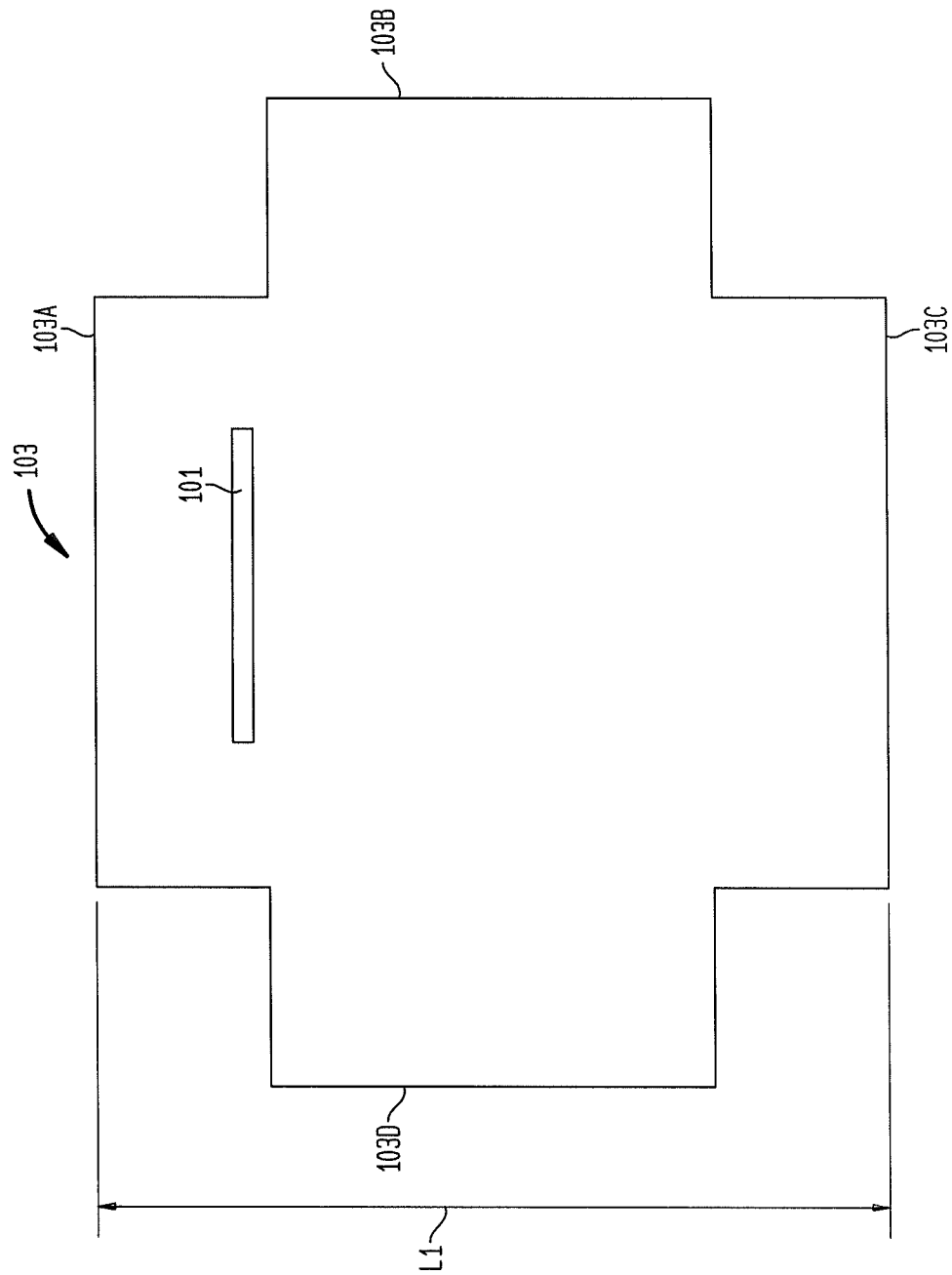

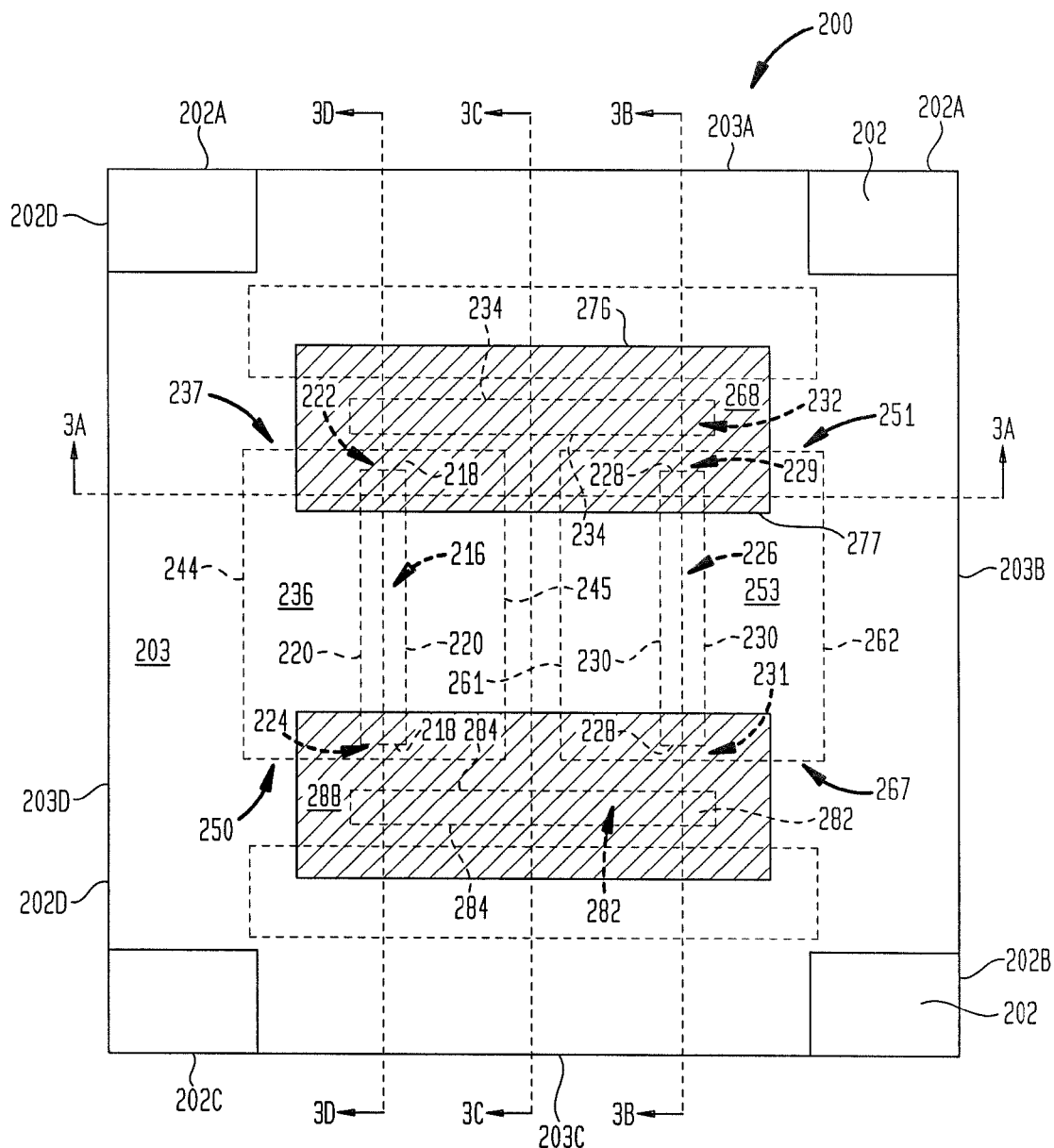

EMBEDDED HEAT SPREADER FOR PACKAGE WITH MULTIPLE MICROELECTRONIC ELEMENTS AND FACE-DOWN CONNECTION

CROSS-REFERENCE TO RELATED APPLICATIONS

This application relates to commonly owned U.S. Provisional Patent Application No. 61/477,877 entitled "Multiple Die Face-Down Stacking For Two Or More Die" and filed on Apr. 21, 2011, the disclosure of which is incorporated herein by reference.

FIELD OF THE INVENTION

The subject matter of the present application relates to microelectronic packages and assemblies, particularly such packages and assemblies which incorporate a heat spreader.

BACKGROUND OF THE INVENTION

Microelectronic devices generally comprise a thin slab of a semiconductor material, such as silicon or gallium arsenide, commonly called a die or a semiconductor chip. Semiconductor chips are commonly provided as individual, prepackaged units. The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper or aluminum that is approximately 0.5 microns ($\mu$m) thick. The bond pads could include a single layer or multiple layers of metal. The size of the bond pads will vary with the device type, but will typically measure tens to hundreds of microns on a side.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a substrate, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Despite the various improvements made in the art, further improvements would be desirable in the case of multi-chip packages, particularly for chips having contacts located in central regions of the chips. Certain semiconductor chips, such as some memory chips, are commonly made with the contacts in one or two rows located in a central region of the chip.

BRIEF SUMMARY OF THE INVENTION

In accordance with one aspect of the present invention, there is a microelectronic package that includes a substrate, first and second microelectronic elements, and a heat spreader. There are terminals exposed at the substrate configured for electrical connection with a component external to the package. The first microelectronic element may be adjacent the substrate and a second microelectronic element at least partially overlies the first microelectronic element. A sheet-like heat spreader has an aperture and separates the first and second microelectronic elements. Connection may extend through the aperture and electrically couple the second microelectronic element with the substrate.

In one embodiment, there is a third microelectronic element adjacent the substrate and the second microelectronic element partially overlies the third microelectronic element.

In another embodiment, a fourth microelectronic element at least partially overlies at least one of the first or third microelectronic elements. The heat spreader further includes a second aperture. Second connections may extend through the second aperture and electrically couple the fourth microelectronic element with the substrate.

In another embodiment, the first and second apertures are parallel to one another. Alternatively, the first and second apertures are normal to one another.

In an alternative embodiment, the substrate includes an aperture and connections that include leads having portions aligned with the aperture of the substrate. Alternatively, the leads are wire bonds extending through the aperture of the substrate.

In another embodiment, the heat spreader includes a metal foil. Alternatively, the heat spreader has a first surface facing the second microelectronic element and peripheral edges bounding the first surface. The package further comprises an overmold overlying the substrate, the first and second microelectronic elements, and a portion of the heat spreader. The heat spreader may be exposed at at least one of the peripheral edges of the overmold.

In another embodiment, the heat spreader extends beyond two edges of the overmold. Alternatively, the heat spreader extends beyond four edges of the overmold. In another alternative embodiment, at least one peripheral edge of the heat spreader is exposed at and flush with the at least one peripheral edge of the overmold. Alternatively, the heat spreader may not extend beyond the peripheral edges of the overmold.

In another embodiment, at least a portion of the heat spreader is bent in a direction of the substrate. The heat spreader may be bent in a direction away from the substrate or toward the substrate.

In one embodiment, the heat spreader is in thermal communication with the first and second microelectronic elements. Alternatively, the heat spreader may be in thermal contact with a portion of at least one of the first or second microelectronic elements or only the first microelectronic element or only the second microelectronic element. In another embodiment, an assembly includes any of the packages disclosed herein and a circuit panel. The package may be electrically interconnected with the circuit panel and the heat spreader may be joined to the circuit panel.

In accordance with another aspect of the present invention, there is a microelectronic package that includes a substrate, first and second microelectronic elements, and first and second heat spreaders. Terminals may be exposed at the substrate configured for electrical connection with a component external to the package. The first microelectronic element may be adjacent the substrate and a second microelectronic element at least partially overlies the first microelectronic element. A sheet-like heat spreader has an aperture and separates the first and second microelectronic elements. Connection may extend through the aperture and electrically couple the second microelectronic element with the substrate. Alternatively, the package may be electrically interconnected with the circuit panel and the heat spreader joined to the circuit panel.

In another aspect of the present invention, there is a system that comprises a microelectronic package, according to any of the abovementioned aspects, and one or more other electronic components electrically connected with the assembly. In an alternative embodiment, there is also a housing, and the microelectronic package and the other electronic components may be mounted to the housing.

In yet another aspect of the present invention, there is a method of making the microelectronic packages disclosed herein that includes the steps of providing a substrate that has terminals thereon that is configured for electrical connection with a component external to the package; arranging a first microelectronic element adjacent the substrate and a second microelectronic element at least partially overlying the first microelectronic element; providing a sheet-like heat spreader with an aperture and positioning the heat spreader between the first and second microelectronic elements; and electrically connecting the second microelectronic element with the substrate using connections extending through the aperture.

In another embodiment, a third microelectronic element is positioned adjacent the substrate so that the second microelectronic element partially overlies the third microelectronic element.

In an alternative embodiment, a fourth microelectronic element may be arranged within the microelectronic package so that the at least fourth microelectronic element partially overlies at least one of the first or third microelectronic elements. Additionally, the fourth microelectronic element may be electrically connected with the substrate using second connections extending through a second aperture within the heat spreader.

In another embodiment, the first and second apertures are parallel to one another. Alternatively, the first and second apertures are normal to one another.

BRIEF DESCRIPTION OF THE DRAWINGS

FIG. 2 is a top plan view of the microelectronic package shown in FIG. 1.

FIG. 2F is a top plan view of a heat spreader in accordance with one embodiment of the invention.

FIG. 3 is a top plan view of a microelectronic package in accordance with an alternative embodiment.

DETAILED DESCRIPTION

Figure 1:
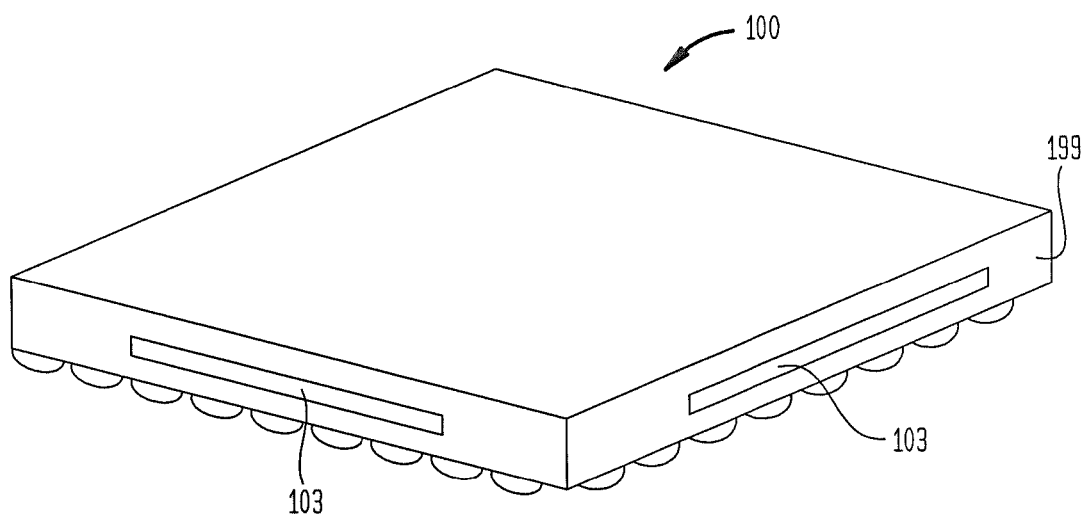
FIG. 1 is a perspective view of a microelectronic package in accordance with one embodiment.
Figure 2A:
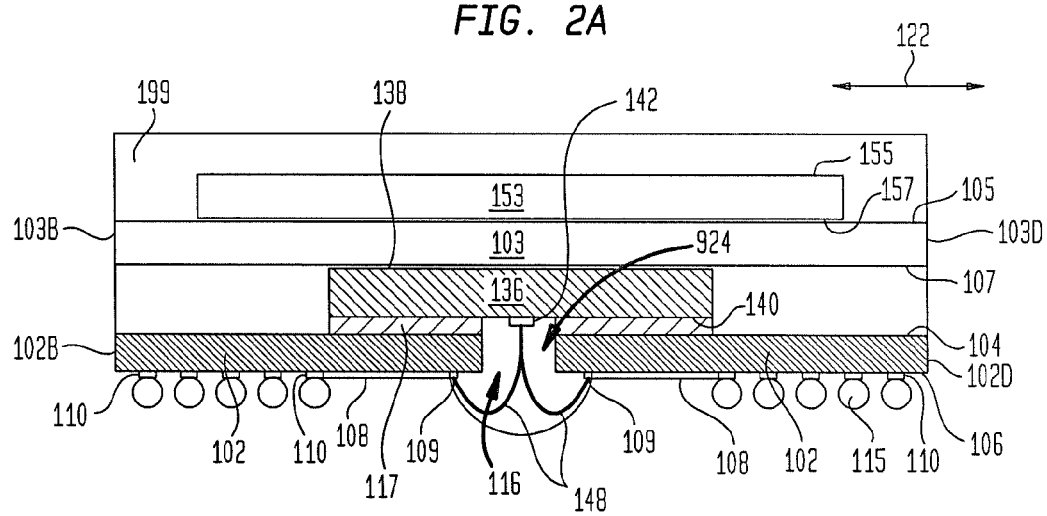
FIG. 2A is a cross-sectional view of the microelectronic package shown in FIG. 2, taken along line 2A-2A.
Figure 2B:
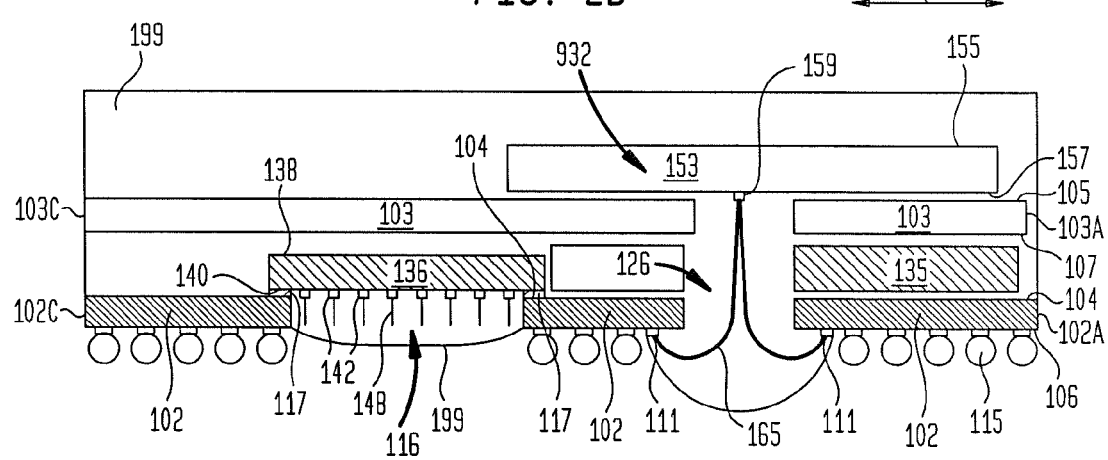
FIG. 2B is a cross-sectional view of FIG. 2, taken along line 2B-2B.
Figure 2C:
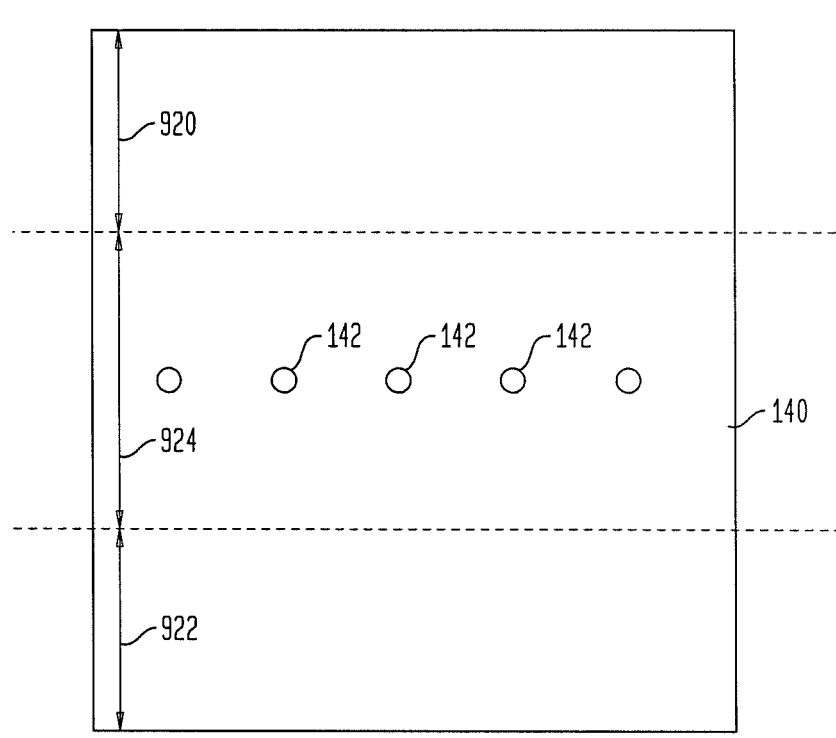
FIG. 2C is a top plan view of the front surface of a microelectronic element shown in FIG. 2.

FIG. 1 illustrates a microelectronic package 100 in accordance with an embodiment of the present invention. In this embodiment, microelectronic package 100 includes a heat spreader 103 and one or more microelectronic elements encapsulated within an encapsulant, such as overmold 199. FIG. 2A, a top plan view of FIG. 1, as well as the corresponding cross-sectional views shown in FIGS. 2A-2B, provide further details of microelectronic package 100. It is to be appreciated that in the top plan view of FIG. 2A, to better illustrate the stacked arrangement of the components within the microelectronic package 100, the overmold 199 is not illustrated. However, in the cross-sectional views shown in FIGS. 2A and 2B, the overmold 199 will be illustrated.

With reference now to FIGS. 2 and 2A, microelectronic package 100 includes first and second microelectronic elements 136,153 overlying a substrate 102. The first and second microelectronic elements 136 may be any type of semiconductor chips. In a particular embodiment, the first and second microelectronic elements 136, 153 can be one which is configured to predominantly provide memory storage array function, i.e., one which has a greater number of active devices therein for providing memory storage array function than any other function. The microelectronic element may include a semiconductor chip implemented in one or more of the following techniques, DRAM (dynamic random access memory), NAND flash memory, resistive RAM (RRAM), phase-change memory (PCM), magnetroristive memory, spin-torque RAM, or serial access memory, among others. As is typical with regard to DRAM chips, the conductive elements of the first microelectronic elements may include first bond pads 142 that extend along the central region 950 of the front surface 140 of the first microelectronic element 136. As best shown in FIG. 2C, the surface area of the front surface 140 of the first microelectronic element 136 may be divided into three regions having substantially equal widths in a direction between the first and second edges of the first microelectronic element: a first outer region 920, a second outer region 922, and a central region 924 positioned between the first outer region 920 and second outer region 922. For example, if the length between the long edges is 6 microns, the respective lengths of the first outer, second outer, and central regions may be 2 microns. The central region 924 would therefore be positioned 2 microns from the first edge 144 and 2 microns from the second edge 145. In other words, the central region 924 can be positioned in the middle third of the first microelectronic element 136. The front surface 140 faces and can be attached to the first surface 104 of the substrate 102 such as using an adhesive 117 or other bonding technique compatible with the materials of the microelectronic element and substrate.

Similarly, the second microelectronic element 153 has opposed first and second edges 161,162 and opposed third and fourth edges 163,164 extending between the rear surface 155 and front surface 157 of the second microelectronic element 153 and adjacent first and second edges 161,162. Conductive elements, such as bond pads 159, extend along the front surface 157 of the second microelectronic element 153. In this embodiment, the second microelectronic element 153 may be a semiconductor chip, such as a DRAM chip, with bond pads 159 positioned along a central region 932 of the second microelectronic element 153, which is positioned between a first outer region 928 and a second outer region 930. In one embodiment, bond pads 159 can extend in a direction transverse to the direction bond pads 142 on the first microelectronic element 136 extend.

In particular embodiments, the substrate 102 can include a dielectric element of various types of construction, made of polymeric material or inorganic material such as ceramic or glass, the dielectric element having conductive elements thereon such as terminals and leads, e.g., traces, substrate contacts, or other conductive elements electrically connected with the terminals. In another example, the substrate 102 can consist essentially of a semiconductor material such as silicon, or alternatively include a layer of semiconductor material and one or more dielectric layers thereof. In yet another embodiment, the substrate can be a lead frame having leads, wherein the terminals can be portions of the leads, such as end portions of the leads.

As best shown in FIGS. 2A and 2B, the substrate 102 includes a first surface 104 and a second surface 106 remote therefrom. Although the thickness of the substrate 102 will vary with the application, the substrate 102 most typically is about 10 to 100 micrometers (microns) thick. The substrate 102 may have conductive traces 108 and a plurality of terminals 110, first set of contacts 109, and second set of contacts 111, exposed at a surface thereof. The terminals can be electrically conductive contacts such as pads, posts, bumps, or other structure, and may include electrically conductive joining units 115 of a bond metal, e.g., solder tin, indium, gold, or other electrically conductive bond material for use in joining the package with another component such as contacts on a circuit panel. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

Conductive traces, such as conductive traces 108 (FIG. 2D), may be formed on the second surface 106 of substrate 102 from any electrically conductive material, but most typically are formed from copper, copper alloys, nickel, aluminum, or combinations of these materials. The thickness of the traces will also vary with the application, but typically is about 5 to 25 microns. The substrate 102 and traces 108 can be fabricated by a process such as that disclosed in co-pending, commonly assigned U.S. Pat. No. 7,462,936, the disclosure of which is incorporated by reference herein.

Referring to FIGS. 2 and 2B, the substrate 102 may further include at least two openings extending between the first surface 104 and second surface 106 of the substrate 102. As previously discussed in the embodiments herein, the first opening 116 may be positioned near the central portion of the substrate 102 and have a pair of short edges 118 and a pair of long edges 120 that have a length L (FIG. 2) that is greater than the length of the short edges 118 to define a longest dimension of the opening. A second opening 126 may extend in a direction transverse to the first opening 116. In this embodiment, the second opening 126 extends in a direction that is perpendicular to the first opening 116, so that the first and second openings 116,126 form the shape of a T. It is to be appreciated that the first and second openings 116,126 may alternatively be joined together to form one continuous opening. In another alternative embodiment, the first opening 116 or second opening 126 may be comprised of a plurality of openings, such that the first opening 116 is alternatively a plurality of openings arranged, i.e., spaced apart from one another, in one direction parallel to the surface 106, and the second opening 126 is alternatively a plurality of openings which are spaced apart from one another in a direction transverse to the first opening 116. It is to be further appreciated that the openings may also take on any alternative shape or design.

As best shown in FIGS. 2, 2A, 2B, the first microelectronic element 136 and second microelectronic element 153 are stacked in face-down positions, such that at least a portion of the second microelectronic element 153 overlies a rear surface 138 (FIG. 2A) of first microelectronic element 136.

Front surface 140 includes a plurality of bond pads or contacts 142 exposed thereat. The front face 140 faces and can be attached to the first surface 104 of the substrate 102 such as using an adhesive 117 or other bonding technique compatible with the materials of the microelectronic element and substrate.

With reference to FIGS. 2A and 2B, the bond pads 142 of the first microelectronic element 136 may be positioned directly over the first opening 116 of the substrate 102. This allows the bond pads 142 to be exposed through the first opening 116. The bond pads 142 may be electrically connected to a first set of contacts 109 on the second surface 106 of the substrate 102. In one embodiment, wire bonds 148 can extend from the bond pads 142 on the first microelectronic element 136, through the first opening 116, and to the first set of contacts 109 on the second surface 106 of the substrate 102. Traces 108 (FIG. 3) can be used to connect the first set of contacts 109 to the terminals 110.

A heat spreader 103 may overlie the first microelectronic element 136. A spacer 135 (FIG. 2B) may be positioned between the substrate 102 and the heat spreader 103 to support the heat spreader 103 at a height above the surface 104 of the substrate. As best seen in FIG. 2F, a top plan view of the heat spreader standing alone, heat spreader 103 can be a continuous, planar, and sheet-like element. Heat spreader 103 is in the shape of a cross, but any desired shape, such as round, triangle, square, or rectangular, may be considered. Heat spreader 103 includes outer edges 103A,103B,103C,103D and at least one aperture 101 that extends between the first and second surfaces 105,107 (FIGS. 2A,2B,2E). In a particular embodiment, the aperture 101 should be positioned so that all or a portion of the aperture 101 can be aligned with second opening 126. This will enable wire bonds extending from an overlying microelectronic element, such as the second microelectronic element 153, to pass therethrough, as will be discussed in greater deal herein.

The heat spreader 103 may be partly or entirely made of any suitable thermally conductive material. Examples of suitable thermally conductive material include, but are not limited to, metal, graphite, thermally conductive adhesives, e.g., thermally conductive epoxy, a solder, or the like, or a combination of such materials. In a particular embodiment, heat spreader 103 is attached to or disposed on the rear surface 138 of the first microelectronic element 136, such as with a thermally conductive material such as a thermally conductive adhesive or thermally conductive grease. The adhesive, if present, can be a compliant material which permits relative movement between the heat spreader and the microelectronic element to which it is attached, such as to accommodate differential thermal expansion between the compliantly attached elements. The heat spreader 103 may also contact second microelectronic element 153. The heat spreader 103 may be a monolithic structure. Alternatively, the heat spreader 103 may include multiple spreader portions spaced apart from one another. In a particular embodiment, the heat spreader 103 may be or include a layer of solder joined directly to at least a portion of a rear surface 138 of the first microelectronic element 136.

With reference to FIGS. 2A and 2B, in one embodiment, one or more edges 103A,103B,103C,103D of the heat spreader 102 should be aligned with at least one edge 102A,102B,102C,102D of the substrate 102. In a particular example, each of the edges 103A,103B,103C,103D of the heat spreader 103 will be aligned with the respective edges 102A,102B,102C,102D of the substrate 102. In alternative embodiments, one or more edges of the heat spreader 103 will not be aligned with edges of the substrate. In alternative embodiments, heat spreader 103 can take on a variety of configurations. In certain embodiments, edges may extend upward, downward, around the edges of microelectronic elements or other devices within the microelectronic package, or any desired configuration. It may also be desired for the heat spreader 103 to have a non-planar configuration or for the heat spreader to be comprised of one or more panels or sheets.

Conductive elements, such as bond pads 159, also extend along the front surface 157 of the second microelectronic element 153. (FIG. 2D) In this embodiment, the second microelectronic element 153 may also be a semiconductor chip, such as a DRAM chip, with bond pads 159 positioned along a central region 952 of the second microelectronic element 153. In one embodiment, bond pads 159 can extend in a direction transverse to the direction bond pads 142 on the first microelectronic element 136 extend.

Referring to FIG. 2B, bond pads 159 on the second microelectronic element 153 may be electrically connected with a second set of contacts 111 of the plurality of contacts exposed at the second surface 106 of substrate 102. Conductive elements may be used to electrically connect the bond pads 159 on the second microelectronic element 153 with the substrate 102. In this embodiment, electrical connections such as wire bonds 165 may be used to couple the bond pads 159 on the second microelectronic element 153 with the terminals 110 through the second set of contacts 111 exposed at the second surface 106 of the substrate 102. As shown, wire bonds 165 extend through the second opening 126 and connect to the second set of contacts 111.

As shown, traces 112 can extend from the second set of contacts 111 along the second surface 106 and be electrically connected with terminals 110.

Once the stacked package is assembled, an overmold 199 may overlie some or all of the first surface 104 of the substrate 102, and the first and second microelectronic elements 136, 153, and may cover wire bonds 148,165 extending through the respective first opening 116 and second opening 126. (FIGS. 2A,2B.) In one embodiment, when the edges 103A-103D of the heat spreader 103 are aligned with respective edges 102A-102D of the substrate in respective directions 122, 124 parallel to the surface 104 of the substrate, as shown in FIGS. 1 and 2, edges 103A-103D of the heat spreader 103 can be exposed at edges of the overmold 199.

Figure 2D:
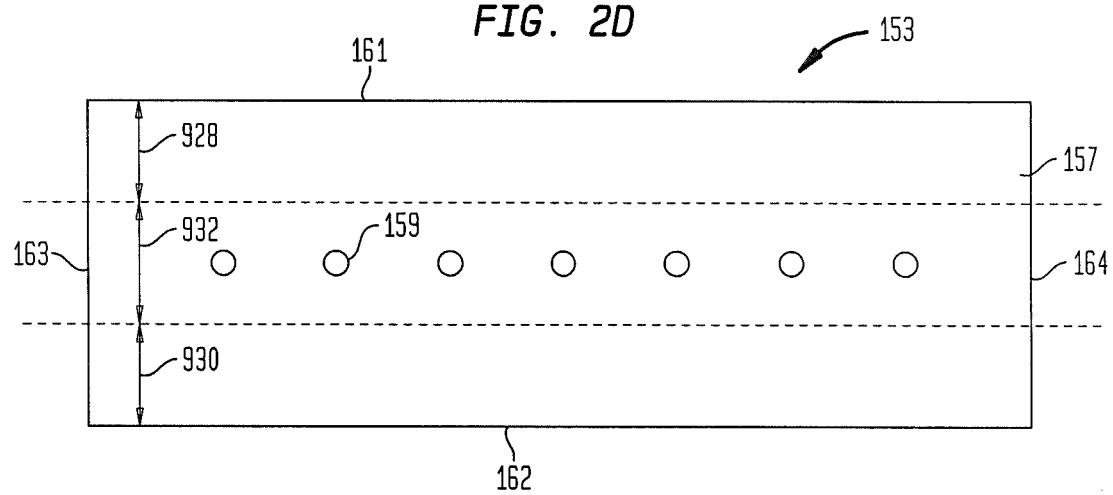
FIG. 2D is a top plan view of the front surface of another microelectronic element shown in FIG. 2.
Figure 2E:
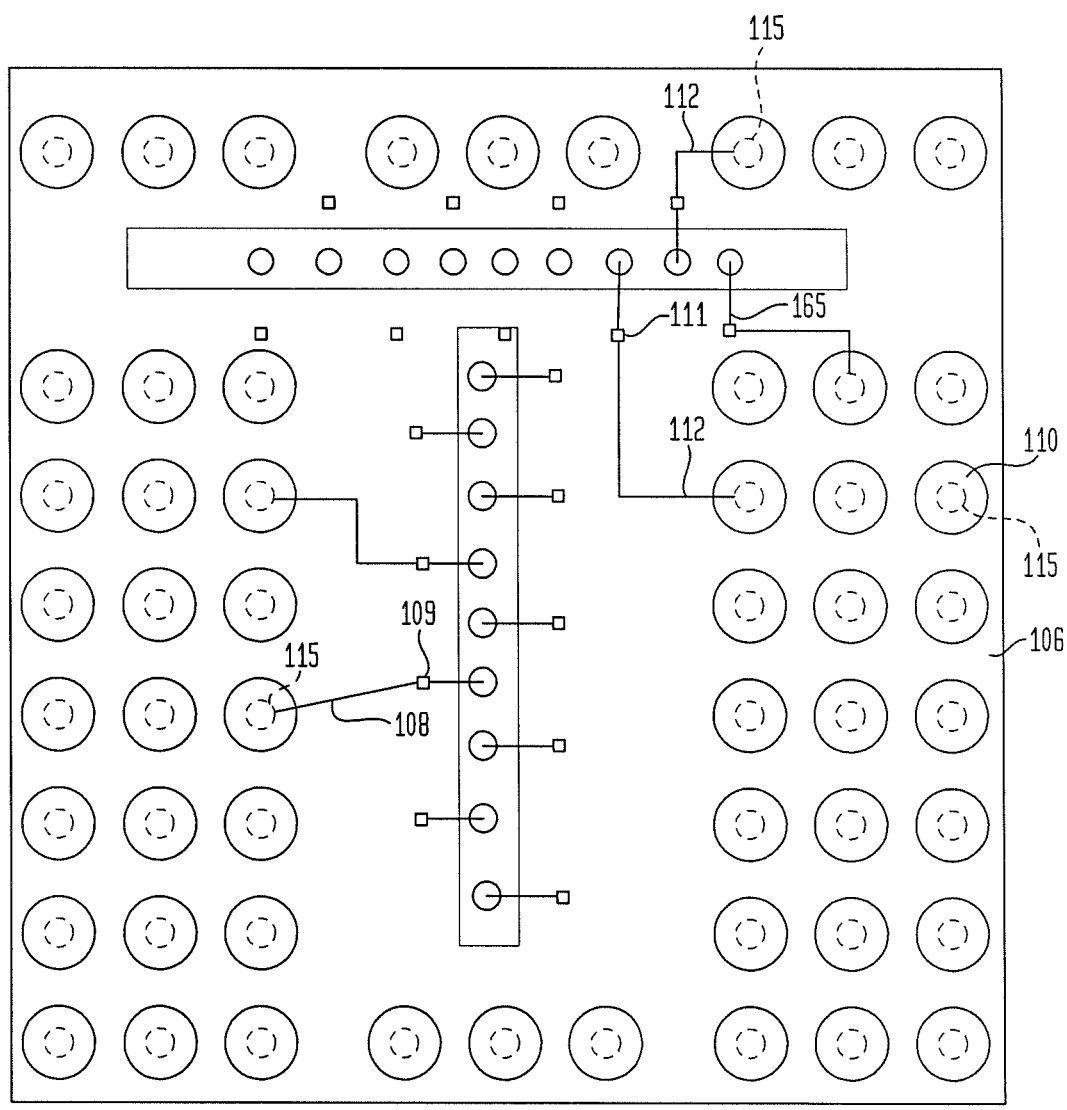
FIG. 2E is a bottom plan view of the microelectronic package shown in FIG. 1.

The remaining embodiments, discussed herein, are similar to the embodiment of FIGS. 1-2D. Accordingly, similar reference numerals will be used to describe similar elements.

Figure 3A:
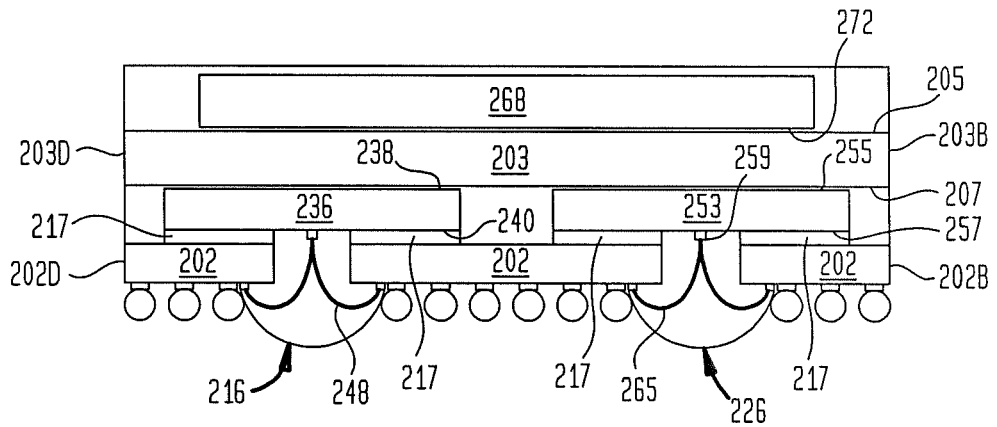
FIG. 3A is a cross-sectional view of FIG. 3, taken along line 3A-3A.
Figure 3B:
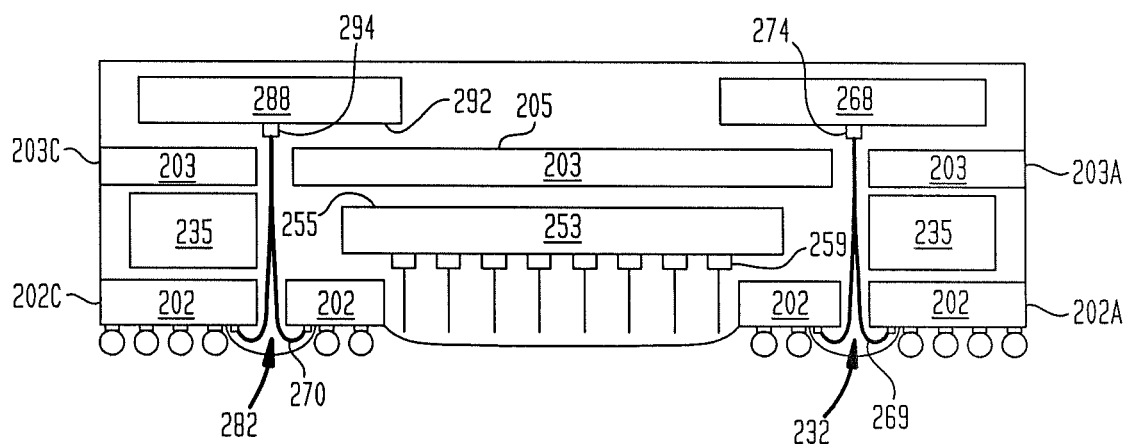
FIG. 3B is a cross-sectional view of FIG. 3, taken along line 3B-3B.
Figure 3C:
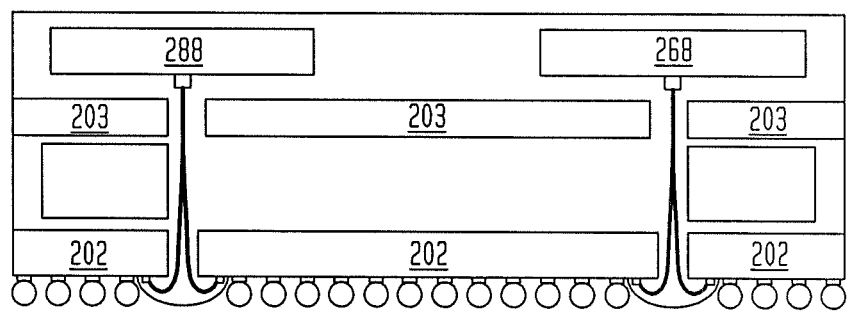
FIG. 3C is a cross-sectional view of FIG. 3, taken along line 3C-3C.
Figure 3D:
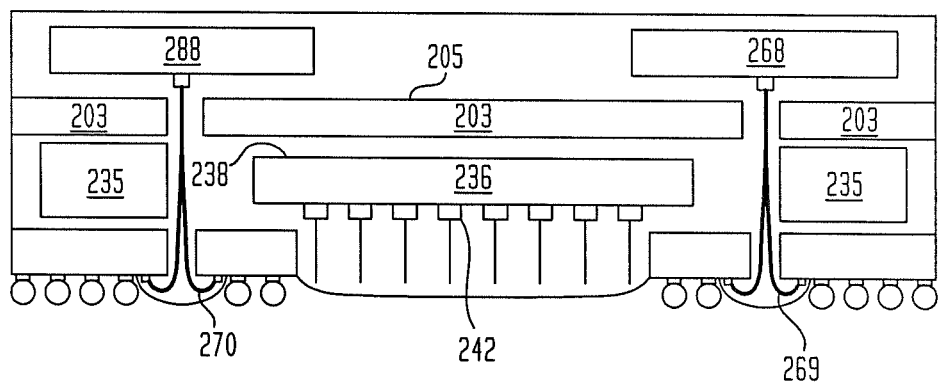
FIG. 3D is a cross-sectional view of FIG. 3, taken along line 3D-3D.

Referring to FIGS. 3-3D, there is shown a microelectronic package incorporating a heat spreader 203 in accordance with an alternative embodiment. Referring first to FIG. 3, a top plan view of the microelectronic package 200 is shown. It is to be appreciated that for ease of discussion and illustration, microelectronic package 200, illustrated in FIG. 3, does not show the presence of the encapsulant (see FIG. 3A), which encapsulates each of the components of the microelectronic package. However, subsequent views, shown in FIGS. 3A-D, will illustrate the presence of the encapsulant. Microelectronic package 200 includes two lower microelectronic elements (first and second microelectronic elements) and two upper and stacked microelectronic elements (third and fourth microelectronic elements), all of which overlie a substrate 202 in a face-down position.

In this embodiment, four openings extend between the first and second surfaces 204,206 of the substrate 202. As best shown in FIG. 3, the first and second openings 216,226 are parallel to one another and both extend in a direction that is perpendicular or normal to the direction the third and fourth openings 232,282 extend. The first opening 216 has long edges 220 and short edges 218, wherein the short edges 218 are located at a first end 222 and a second end 224 of the first opening 216. The second opening 226 also has a pair of short edges 228 and a pair of long edges 230, wherein the short edges 228 are respectively located at a first end 229 and a second end 231 of the second opening 226. The third opening 232 is located adjacent the respective first ends 222,229 of the first and second openings 216,226, whereas the fourth opening 282 is located adjacent the respective second ends 224, 231 of the first and second openings 216,226. In this embodiment, the respective long edges 234,284 of the third and fourth openings 232,282 are not aligned with the long edges 220,230 of the respective first and second openings 216,226. As shown, the first and second openings 216,226 are spaced further away from the outer peripheral edge 212 of the substrate 202 than the third and fourth openings 232,282.

Referring to FIGS. 3-3D, the front surface 240, 257 of the first and second microelectronic elements 236,253 may each be attached to the substrate 202 such as with an adhesive 217 or other suitable bonding technique with the first microelectronic element 236 and the second microelectronic element 253 spaced apart from one another in a direction along the first surface 204 of the substrate 202. Bond pads 242 on the first microelectronic element 236 may be aligned with the first opening 216, and bond pads 259 on the second microelectronic element 253 may be aligned with the second opening 226 so that the bond pads of each, microelectronic element 236, 253 are exposed through the respective opening 216, 226. As shown, the first and second edges 244,245 of the first microelectronic element 236 and the first and second edges 261,262 of the second microelectronic element 253 are parallel to one another and extend in the same direction.

Heat spreader 203 overlies the rear surface 238 of the first microelectronic element 236, as well as the rear surface 255 of the second microelectronic element 253. Optionally, one or more spacers 235 (FIG. 3B) may be used to support the portions of the heat spreader 203 that face toward the substrate 202, but do not overlie the first and/or second microelectronic elements 236,253. In an exemplary embodiment, each of the edges 203A-203D (FIG. 3) of the heat spreader will be aligned with the edges 202A-202D of the substrate 202. (FIGS. 3A,3B.) As previously discussed, heat spreader 203 can take on a variety of alternative embodiments, including those wherein the edges of the heat spreader are not aligned with edges of the substrate 202.

The third and fourth microelectronic elements 268,288 may be positioned to overlie the substrate 202, first and second microelectronic elements 236,253, and heat spreader 203. As best shown in FIGS. 3 and 3A, front surface 272 of the third microelectronic element 268 directly overlies the first surface 205 of the heat spreader 203, as well as the rear surfaces 238,255 of the first and second microelectronic elements 236, 253. Similarly, the front surface 292 of the fourth microelectronic element 288 overlies the first surface 205 of the heat spreader 203, as well as the rear surfaces 238,255 of the respective first and second microelectronic elements 236, 253.

As shown in FIGS. 3 and 3B-3D, the third microelectronic element 268 is adjacent the respective first ends 237,251 of the first and second microelectronic elements 236,253. The fourth microelectronic element 288 is adjacent the second ends 250,267 of the respective first and second microelectronic elements 236,253. Additionally, the respective first and second edges 276,277 of the third microelectronic element 268 and first and second edges 296,297 of the fourth microelectronic element 288 extend in a direction that is perpendicular to both the respective first and second edges 244,245 of the first microelectronic element 236 and first and second edges 261,262 of the second microelectronic element 253. Referring to FIGS. 3B and 3D, the bond pads 274 extending along central region 946 (FIG. 3B) of the third microelectronic element 268 and the bond pads 294 extending along the central region 948 (FIG. 3B) of the fourth microelectronic element 288 will extend in a direction that is perpendicular to the respective bond pads 242,259 positioned near the respective central regions 950, 952 of the respective first and second microelectronic elements 236, 253.

The orientation of the heat spreader 203 overlying the first and second microelectronic elements 236,253 and underlying the third and fourth microelectronic elements 268,288 will allow for an electrical connection between the bond pads 242 (FIG. 3D), 259 (FIG. 3B), 274, 294 of the first, second, third, and fourth microelectronic elements 236,253,268,288 to the respective first, second, third, and fourth sets of contacts 209,211,213,214 on the second surface 206 of the substrate 202. The electrical connection can be within or through the first, second, third, and fourth openings 216,226,232,282. In this embodiment, wire bonds 248, 265 (FIG. 3A), 269, 270 (FIG. 3B) extending from the respective first, second, third, and fourth microelectronic elements 236,253,268,288 extend through the first, second, third, and fourth openings 216,226, 232,282, and connect to respective first, second, third, and fourth sets of contacts 209,211,213,214 on the substrate 202 (FIGS. 3A,3B).

Figure 3E:
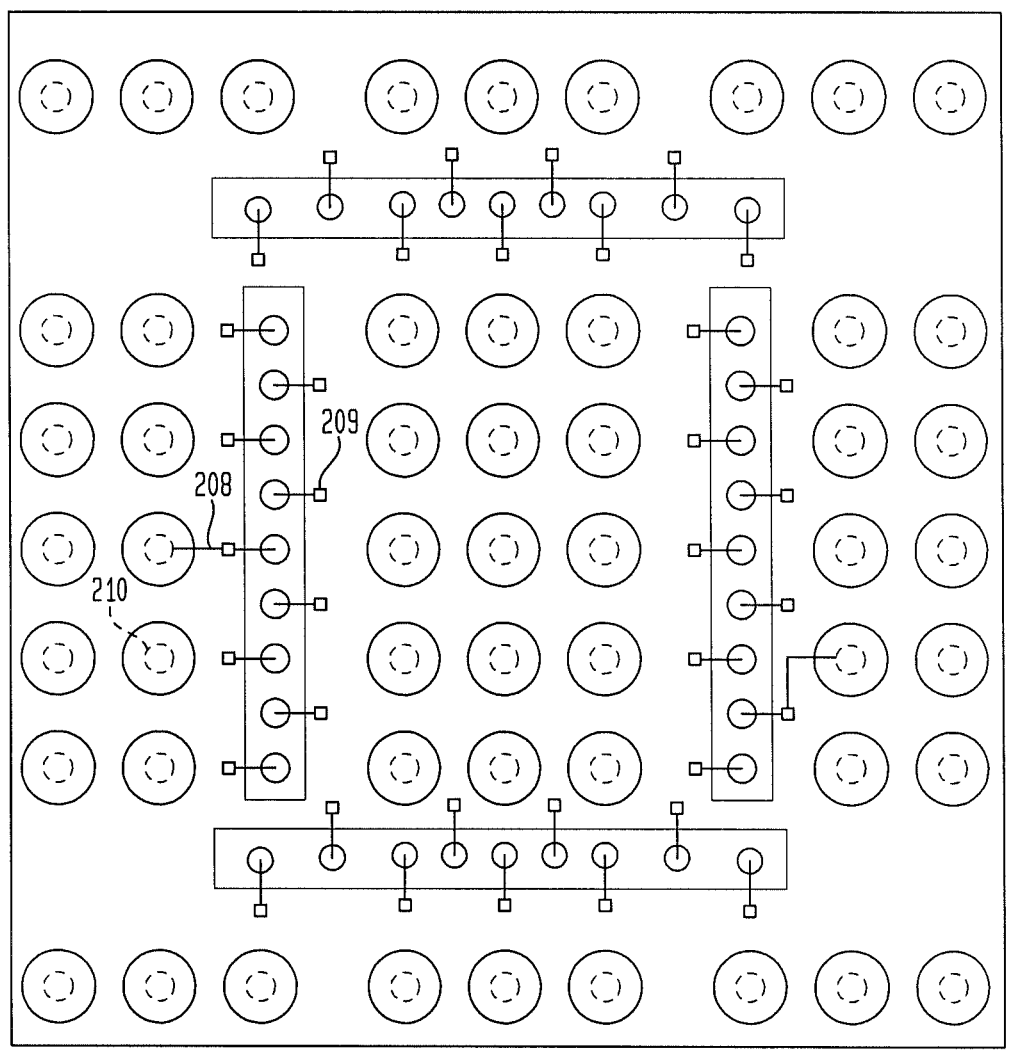
FIG. 3E is a bottom plan view of FIG. 2.

As shown in FIG. 3E, traces 208 extending in a direction parallel to the second surface 206 of the substrate 202 can connect the first, second, third, and fourth sets of contacts 209,211,213,214 to terminals exposed at the second surface.

Figure 4:
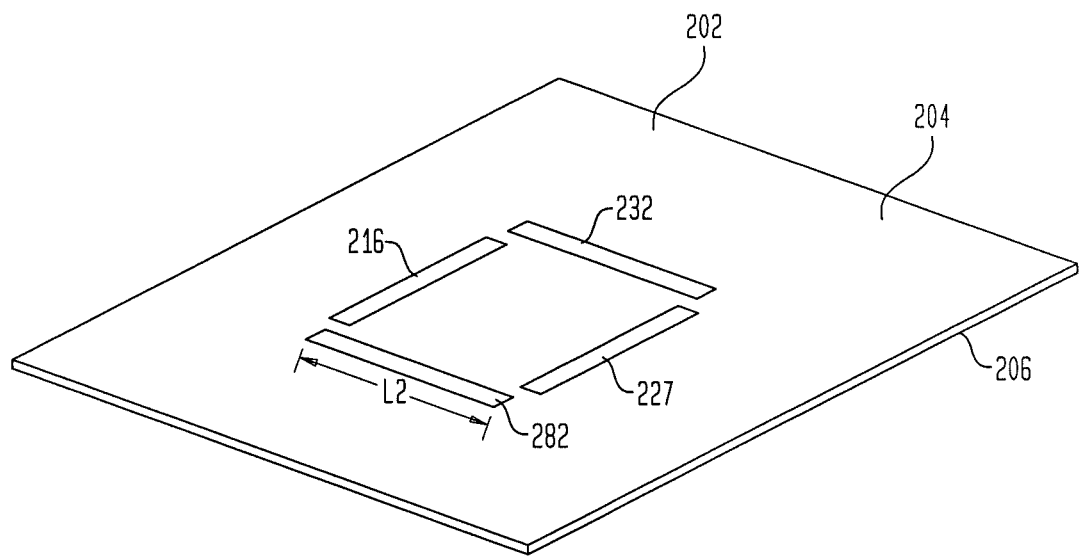
FIGS. 4,4A,4B,4C,4D, AND 4E are perspective views of a method of making the microelectronic package shown in FIG. 3 in accordance with one embodiment.

Turning now to FIG. 4, a method of making the microelectronic package 200, described in FIGS. 3-3E, is disclosed. Referring first to FIG. 4, a substrate 202 is obtained. First, second, third and fourth openings 216,227,232,282 can be provided within the substrate 202 that extend between the first and second surfaces 204,206. As shown, first and second openings 216,227 are spaced apart and parallel to one another. Third and fourth openings 232,282 are also spaced apart and parallel to one another. In the arrangement shown, first and second openings 216,227 extend in a direction perpendicular to the direction third and fourth openings 232,282 extend, such that, in this embodiment, the openings can form the shape of a square.

Figure 4A:
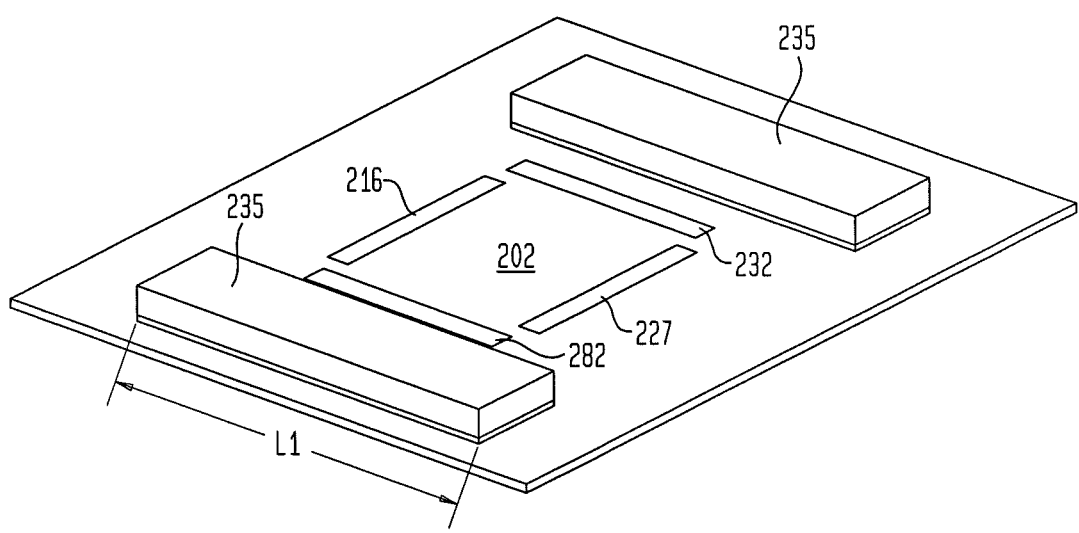

Turning to FIG. 4A, spacers 235 can be provided adjacent the opposed outer edges 202A-D of the substrate 202, as well as adjacent the third and fourth openings 232,282. In a particular embodiment, spacers 235 have a length L1 that is greater than the length L2 of the third and fourth openings.

Figure 4B:
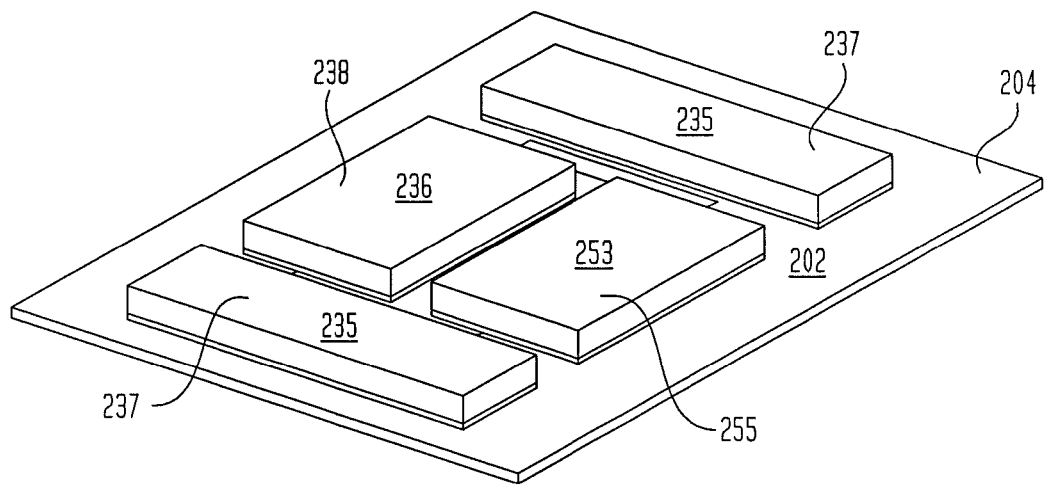

With reference to FIG. 4B, first and second microelectronic elements 236,253 are provided on the first surface 204 of the substrate 202. First and second microelectronic elements 236, 253 will be arranged so that the central bond pads 242 (FIG. 3D) of the first microelectronic element 236 are aligned with the first opening 216 and the central bond pads 259 of the second microelectronic element 253 are aligned with the second opening 226.

Figure 4C:
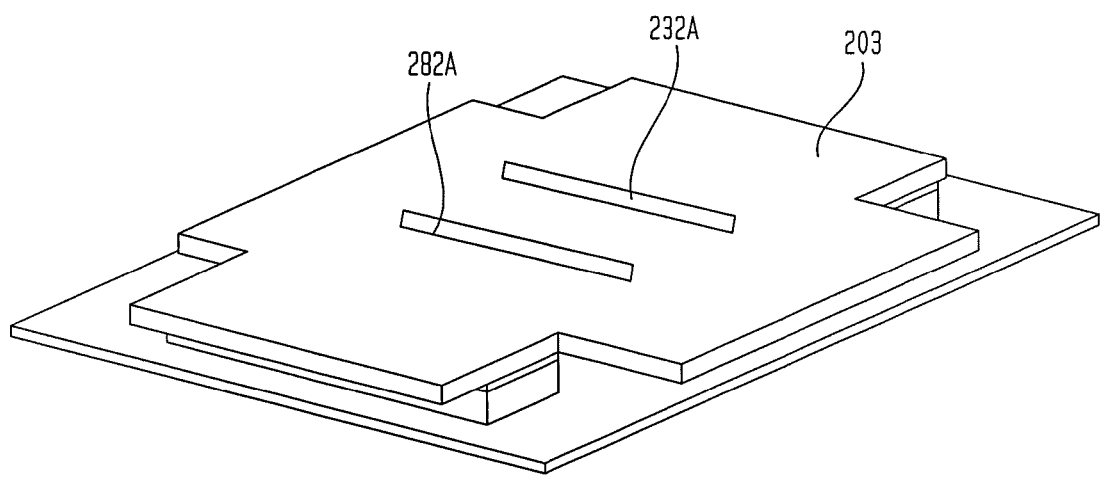

The heat spreader 202 shown in FIG. 4C may overlie spacers 235, and respective rear surfaces 238,255 of the first and second microelectronic elements 236,253. In an exemplary embodiment, the heat spreader 203 is in the shape of a cross. Each of the edges 203A-D of the heat spreader 203 will be aligned with the edges 202A-D of the substrate 202. First and second openings 232A, 282A in the heat spreader 203 extend between the first and second surfaces 205,207 (FIG. 3A) of the heat spreader 203. The first opening 232A will be aligned with the third opening 232 in the substrate 202 to allow for wire bonds 269 to extend therethrough. The second opening 282A will be similarly aligned with the fourth opening 282 in the substrate 202 to allow wire bonds 270 to extend therethrough.

Figure 4D:
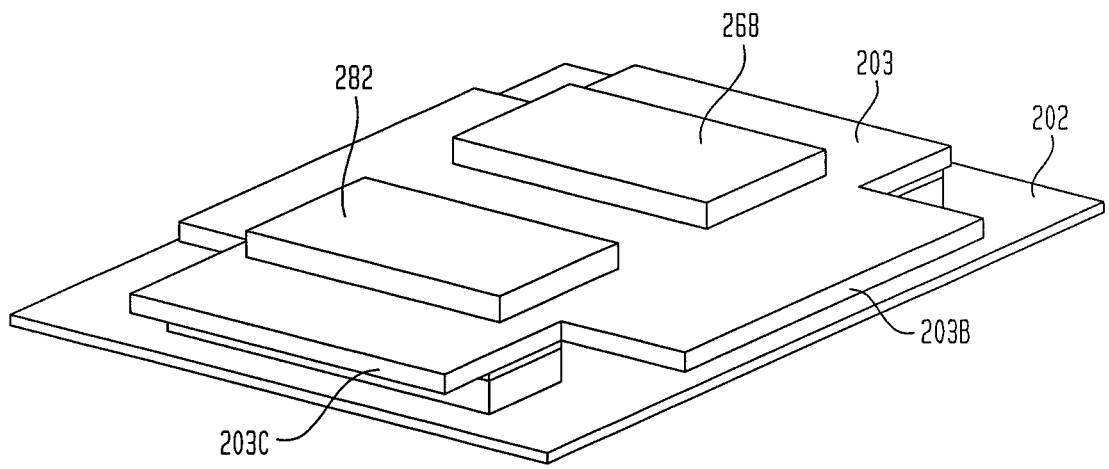

With reference to FIG. 4D, third and fourth microelectronic elements 268,288 are provided over the heat spreader 203 in a face-down position. Bond pads 274 (FIG. 3B) of the third microelectronic element 268 are aligned with the first opening 232A (FIG. 4C) in the heat spreader 203, as well as the third opening 232 (FIG. 4A) in the substrate 202. Similarly, bond pads 294 (FIG. 3B) of the fourth microelectronic element 288 are aligned with the second opening 282A in the heat spreader 203, as well as the fourth opening 282 (FIG. 4C) in the substrate 202 (FIG. 4). Wire bonds (not shown) may then be provided to electrically connect the first and second microelectronic elements with contacts on the second surface 206 of the substrate, as well as to electrically connect the third and fourth microelectronic elements 268, 288 with contacts on the second surface of the substrate 202.

Figure 4E:
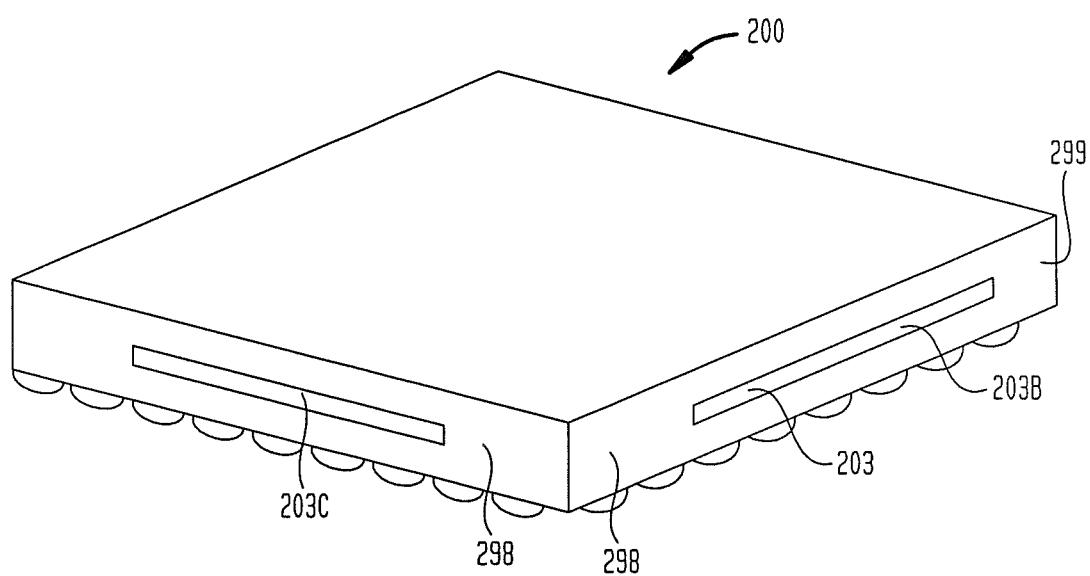
Figure 4F:
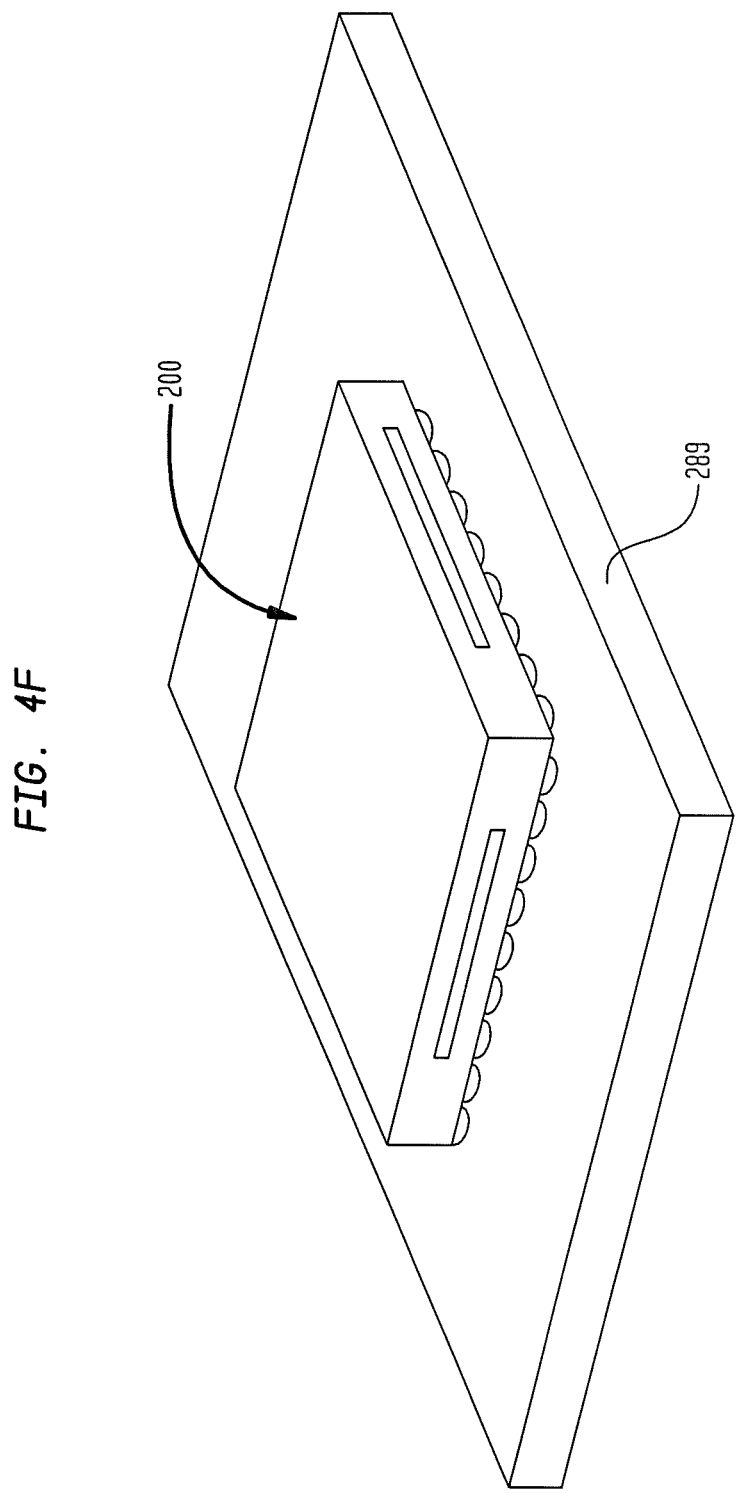
FIG. 4F is an embodiment showing the microelectronic package constructed in FIGS. 4A-4E attached to another device.

Turning to FIG. 4E, an encapsulant may then be provided over each of the components, including the substrate 202, heat spreader 203, and first through fourth microelectronic elements 236,253,268,288, to provide a microelectronic package 200. As shown, the heat spreader 203 may be aligned with the outer edge 298 of the overmold 299, such that the outer edges 203A (not shown), 203B, 203C, and 203D (not shown) may be exposed. The microelectronic package 200 may then be electrically connected with another device, such as, for example, the printed circuit board 289 shown in FIG. 4F.

Figure 5:
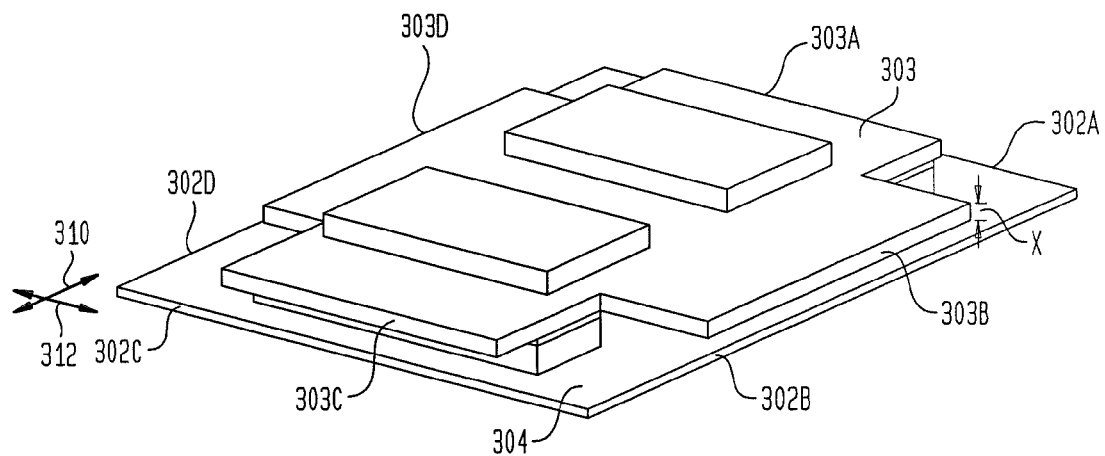
FIGS. 5-5A illustrate a microelectronic package in accordance with an alternative embodiment.
Figure 5A:
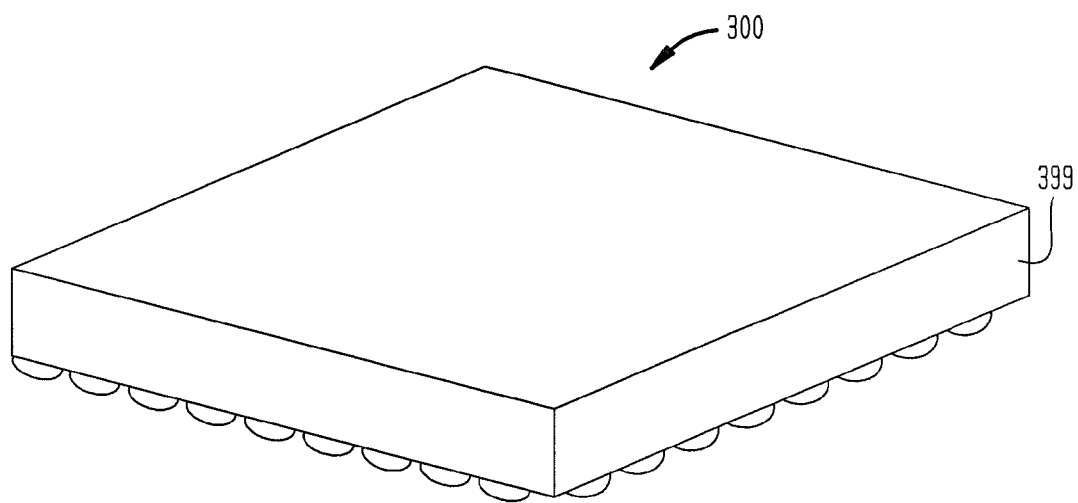

As previously discussed herein, the heat spreader can take on any desired configuration. In one alternative embodiment, one or more of the outer edges of the heat spreader 303 do not align with the substrate 302. In a particular example, as shown in FIG. 5, each of the edges 303A-303D of the heat spreader are spaced back from the corresponding adjacent outer edge 302A-302D of the substrate 302 in a direction 310 or 312 parallel to the surface 304 of the substrate and away from such edge of the substrate. As a result, with reference to FIG. 5A, once the components of the microelectronic package 300 are encapsulated with an overmold 399, or the like, the edges 303A-303D of the heat spreader 303 will be fully encapsulated by the overmold and the heat spreader 303 will not be exposed to the atmosphere. As shown, the overmold will extend continuously around the microelectronic package 300.

Figure 6:
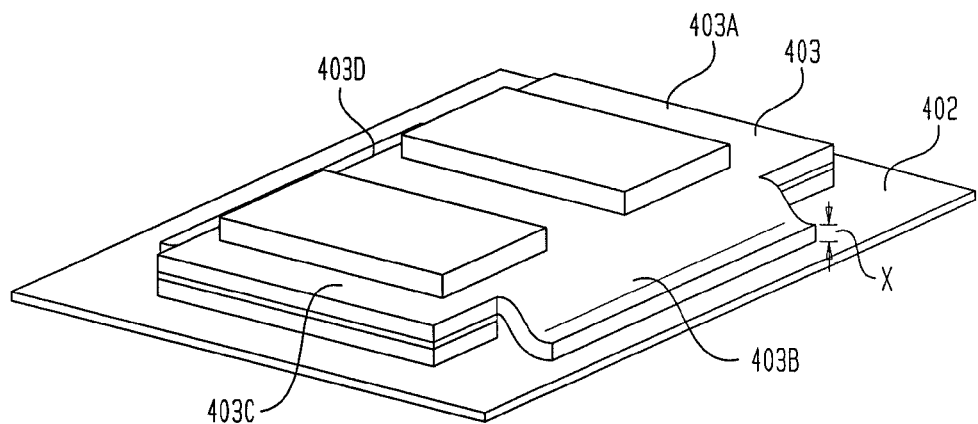
FIGS. 6-6A illustrate perspective views of steps in making a microelectronic package in accordance with another embodiment.
Figure 6A:
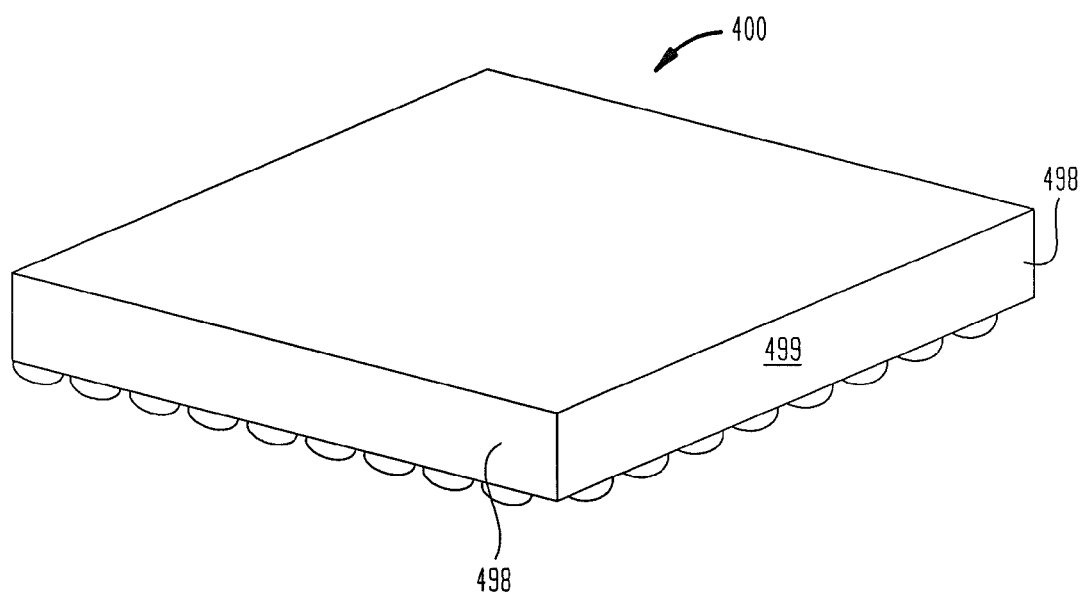

Turning to FIG. 6, a heat spreader 403 is provided wherein some of the edges 403A,403C,403D are aligned with the edges of the spacers 435 and the heat spreader 403 has one flap 403B or edge that extends downward toward the substrate 402. The flap 403B extending toward the substrate 402 can therefore be in thermal communication with the substrate. Because none of the edges 403A-D of the heat spreader 403 extend to the outermost edge of the substrate 402, upon encapsulation, the heat spreader 403 is not exposed to the atmosphere. Thus, the edges 403A-D will not be exposed beyond the edge 498 of the overmold 499, as best seen in the encapsulated microelectronic package 400, shown in FIG. 6A.

Figure 7:
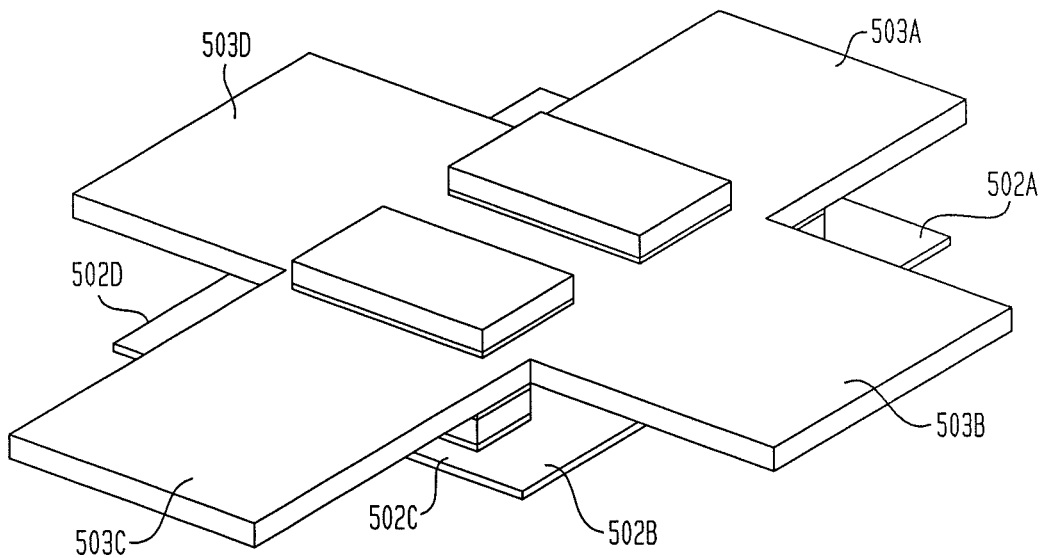
FIGS. 7-7A are perspective views of steps in making a microelectronic package in accordance with another embodiment.
Figure 7A:
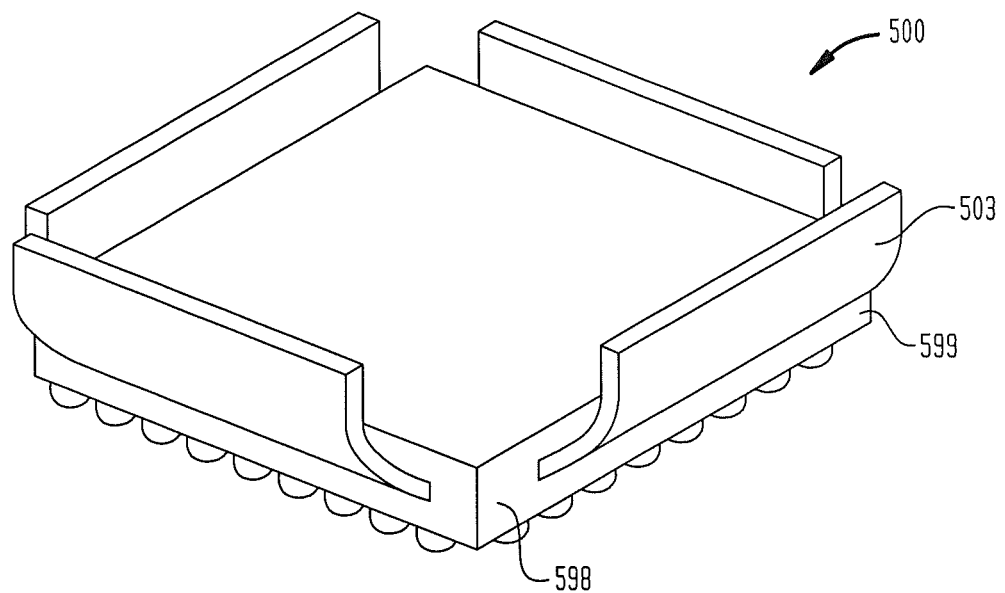
Figure 8:
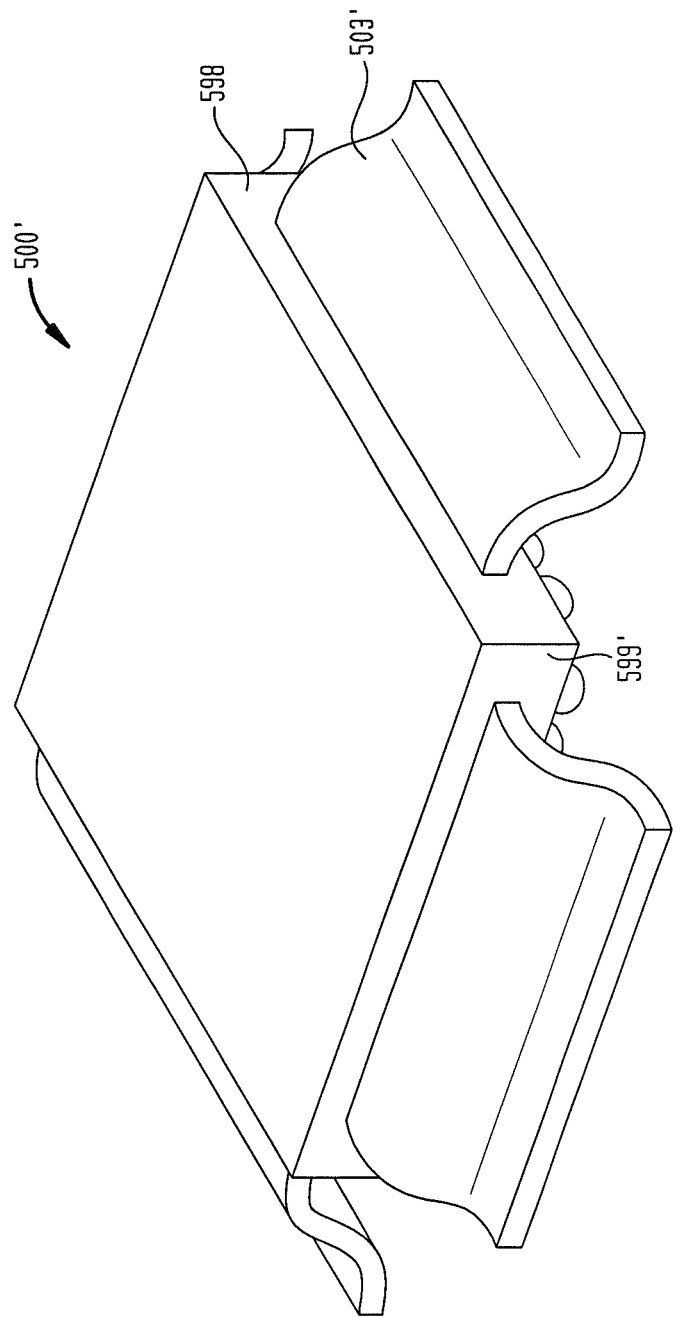
FIG. 8 is a perspective view of an alternative microelectronic package.

With reference now to FIG. 7, an alternative heat spreader 503 is shown with flaps 503A-D extending beyond the edges 502A-D of the substrate 502. As shown in FIG. 7A, when the microelectronic elements are encapsulated, the flaps 503A-D will extend beyond the edges of the overmold 599. As shown, the flaps 503A-D may be formed to point upwards. Alternatively, as illustrated in the microelectronic package 500' shown in FIG. 8, one or more flaps 503A-D' of the heat spreader 503' extending beyond the edge 598 of the overmold 599' may instead extend downwardly toward the second surface 506 of the substrate 502. In some cases, the flaps 503A, 503B, 503C, 503D may be thermally and mechanically affixed to the substrate such as with a bond metal or a thermally conductive adhesive.

Figure 9:
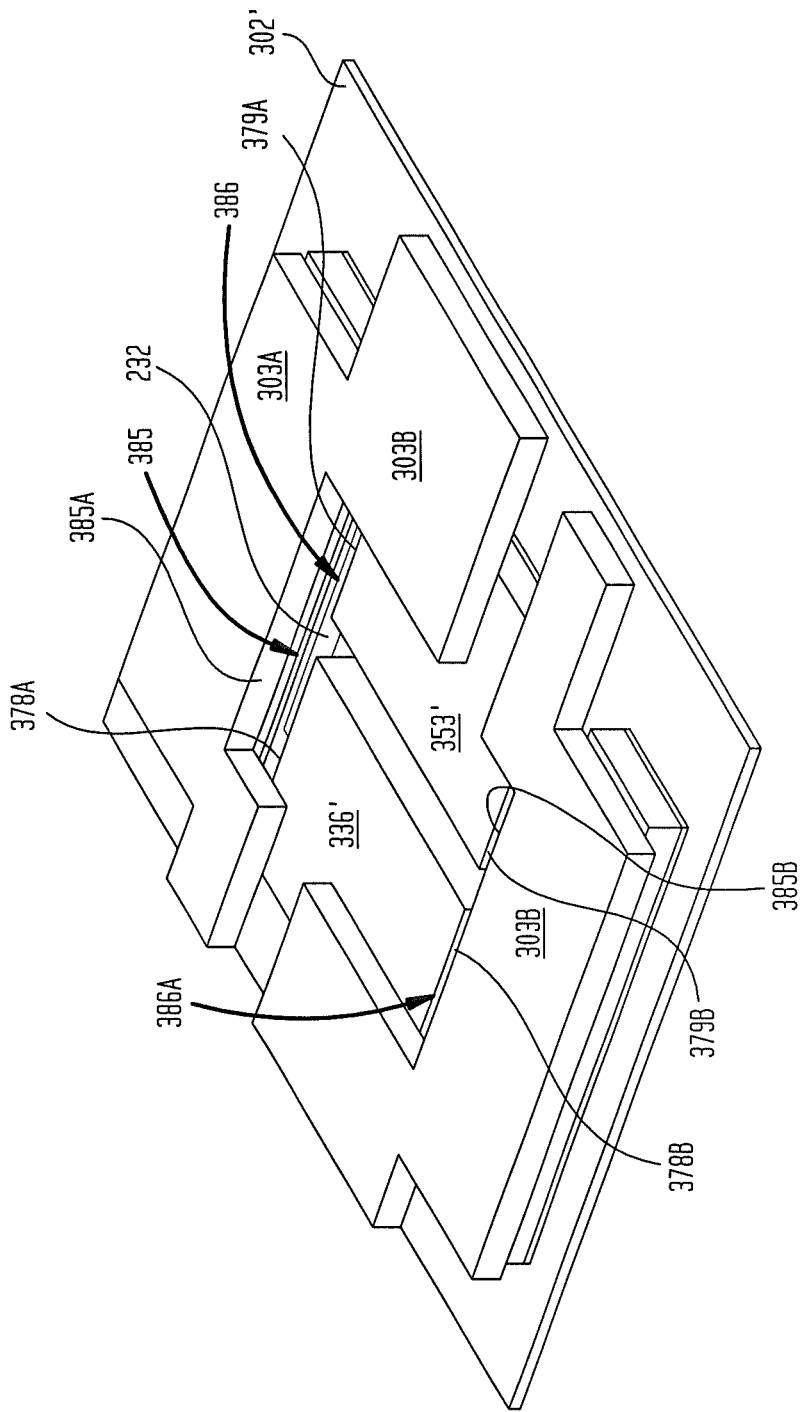
FIG. 9 is a perspective view of an alternative microelectronic package.

Turning to FIG. 9, another alternative embodiment is shown. This embodiment is similar to the embodiment shown in FIGS. 4-4F, except that instead of only one heat spreader, there are two: a first heat spreader 303A and an adjacent second heat spreader 303B. As shown, the first heat spreader 303A and second heat spreader 303B are separated, thereby creating a first opening 385 between them. In this embodiment, the first heat spreader 303A and second heat spreader 303B are mirror images of one another, but they may take on any shape or configuration in alternative embodiments. First and second microelectronic elements 336',353' directly adjacent the substrate 302' are exposed through the first opening 385. A second opening 386 is created between the inner edge 385A of the first heat spreader 303A and the respective edges 378A,379A of the first and second microelectronic elements 336',353'. The second opening 385 is aligned with the opening 232 in the substrate 302'. Similarly, a third opening 386 is created between the edge 385B of the second heat spreader 303B and the opposed edges 378B,379B of the first and second microlectronic elements 336',353'. The third opening 386A is also aligned with the opening (not shown; see opening 282 in FIG. 4A) in the substrate 302'. As in the previous embodiments, third and fourth microelectronic elements (not shown) may be provided over the first and second heat spreaders 303A,303B, and an overmold (not shown) can be provided over the entire assembly.

Figure 10:
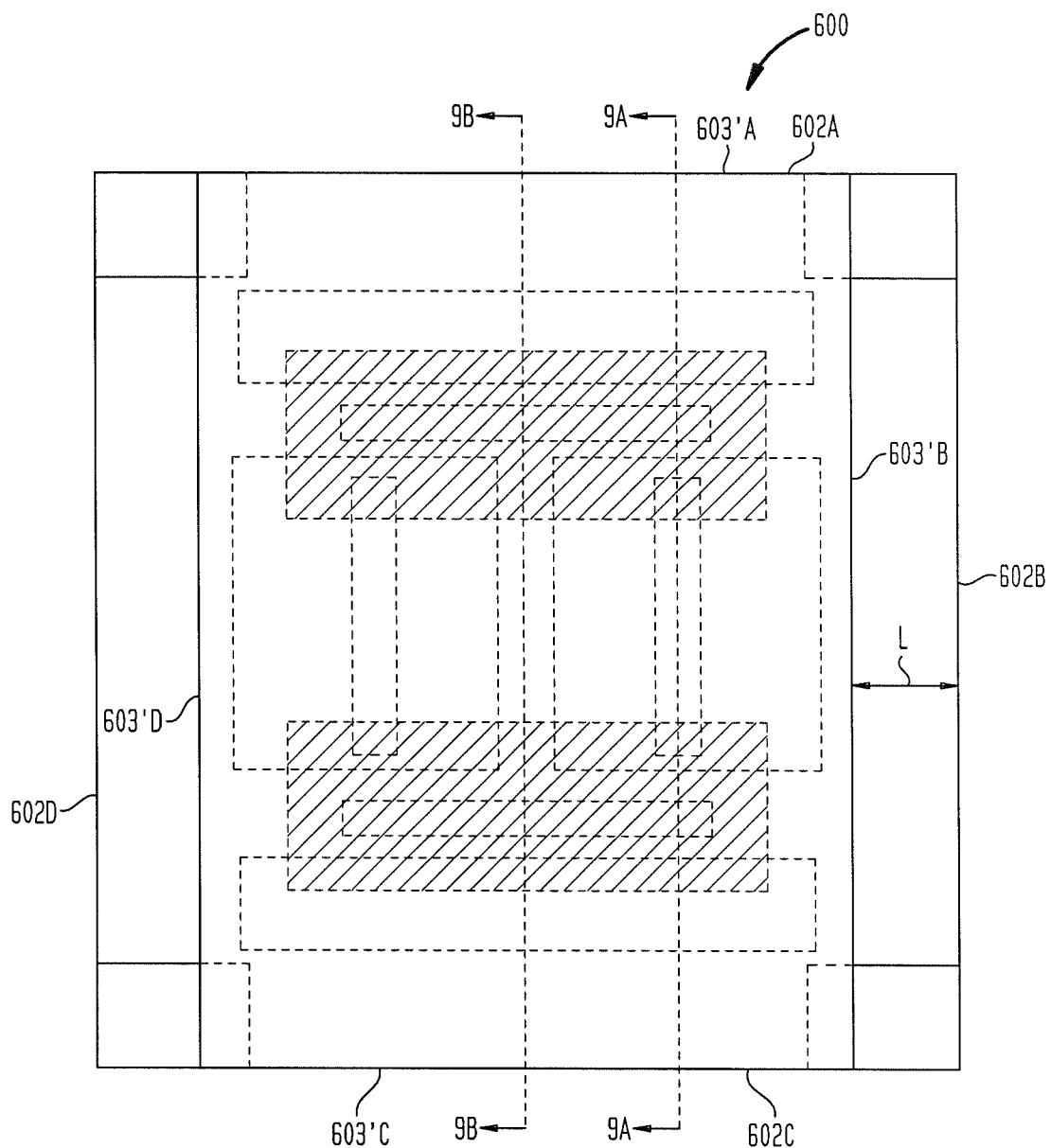
FIG. 10 is a top plan view of the microelectronic package in accordance with another embodiment.
Figure 10A:
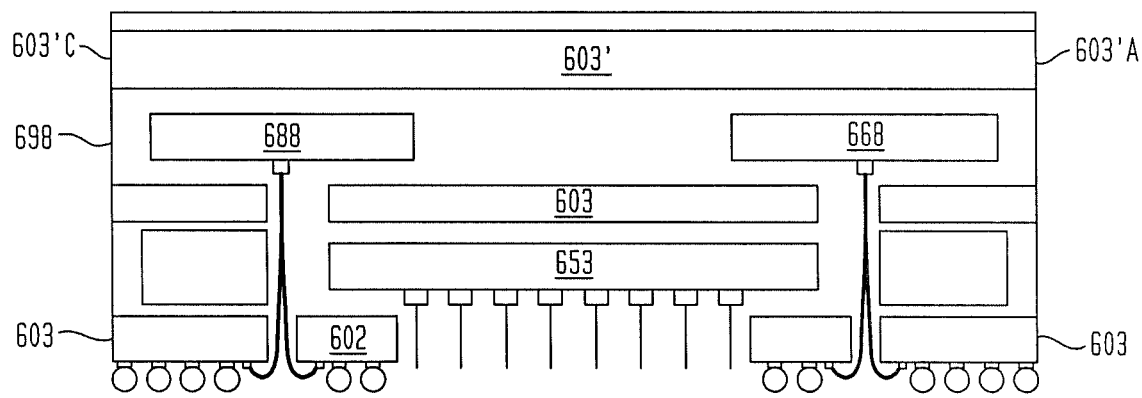
FIG. 10A is a cross-sectional view of FIG. 10, taken along line 10A-10A.
Figure 10B:
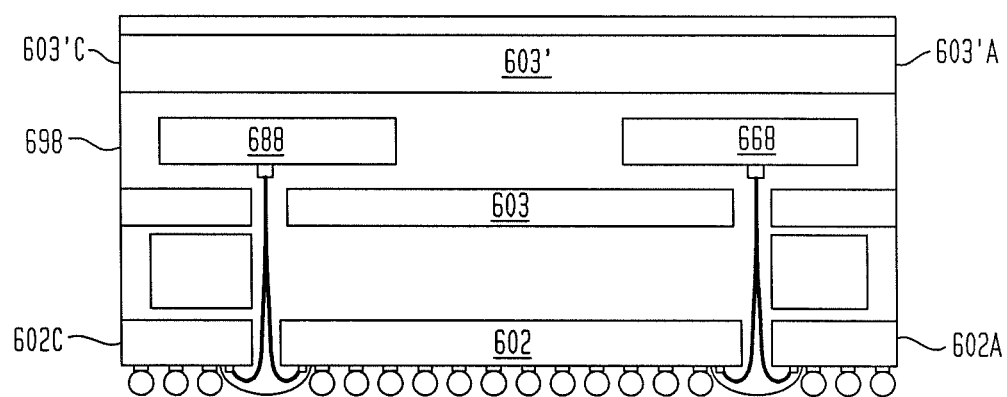
FIG. 10B is a cross-sectional view of FIG. 10, taken along line 10B-10B.

With reference to FIGS. 10,10A, 10B, an alternative microelectronic package 600 is shown. This embodiment is identical to the microelectronic package 200 shown in FIGS. 3-3D, except that there is a second heat spreader 603' overlying the third and fourth microelectronic elements 668,688. In this embodiment, only the outer edges 603'A,603'C of the second heat spreader 603' are aligned with the edges 602A-602D of the substrate 602 or the edge 698 of the overmold 699. As best seen in FIG. 10, edges 603'B,603'D of the second heat spreader 603' are spaced a distance L away from the edges 602B,602D of the substrate 602 and the edge 698 of the overmold 699. In alternative embodiments, the second heat spreader can take on any one of a variety of shapes or configurations.

Figure 11:
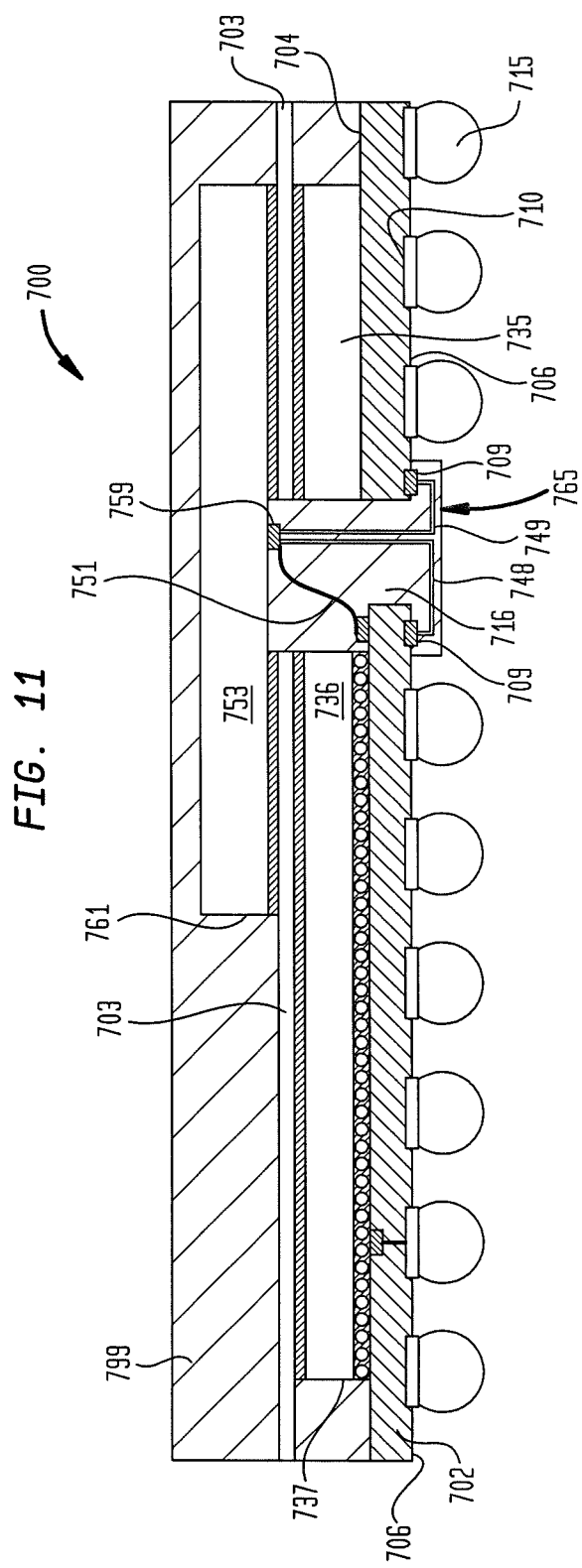
FIG. 11 is a cross-sectional view of a microelectronic package in accordance with another embodiment.

The microelectronic element closest to the substrate 702 (as shown in the previous embodiments) may be configured to overlie the substrate 702 in a variety of configurations, such as a flip chip orientation, or a face-up orientation. In one example, referring to FIG. 11, the microelectronic assembly 700 may include a bond element which electrically connects bond pads 759 of the second microelectronic element 753 to the terminals 710 of the substrate 702. In one embodiment, leads can include bond elements 765 such as wire bonds which extend through aperture 716 and are bonded to bond pads 759 of the second microelectronic element 753 and the substrate 702. The bond wires 765 are at least partially aligned with the opening 716 of the substrate 702. The wire bond 765 may include multiple wire bonds 765 electrically connecting some bond pads of the second microelectronic element 753 with conductive elements 709 exposed at the substrate 702. Wire bonds 748, 749 extend through the opening 716. Each of the wire bonds 748 and 749 electrically couples a bond pad 759 to a corresponding conductive element 747 of the dielectric element 702. The bond wires 765 may include a multiple wire bond structure as described in U.S. patent application Ser. No. 12/907,522 filed Oct. 19, 2010, and entitled "Enhanced Stacked Microelectronic Assemblies with Central Contacts and Improved Thermal Characteristics," the entire disclosure of which is incorporated herein by reference. As seen in FIG. 11, alternatively or additionally, leads such as lead bonds 751 may extend along the first surface 704 of the substrate 702 as shown or along the second surface and into the aperture 716 to electrically connect to bond pads 759. The lead bonds 751 do not necessarily extend through the opening 716 of the dielectric element 702 but are at least partially aligned with the opening 716.

The microelectronic assembly 700 may further include an overmold or encapsulant 799 covering at least the first microelectronic element 736 and the second microelectronic element 753. As seen in FIG. 11, the overmold 799 may also cover portions of the substrate 702 extending beyond the first edge 737 of the first microelectronic element 736 and the first edge 761 of the second microelectronic element 753. Consequently, the overmold 799 may contact at least the first edge 737 of the first microelectronic element 736, the first edge 761 of the second microelectronic element 753, and the first surface 704 of the dielectric element 702. The overmold 799 may be made from any suitable material, including epoxy and the like.

The microelectronic assembly 700 may additionally include a heat spreader or heat sink attached to the rear surfaces of one or more of the first or second microelectronic elements 736,753, as described in U.S. patent application Ser. No. 12/907,522 filed Oct. 19, 2010, and entitled "Enhanced Stacked Microelectronic Assemblies with Central Contacts and Improved Thermal Characteristics," the entire disclosure of which is hereby incorporated herein by reference. In some embodiments, the microelectronic assembly 700 includes a heat spreader thermally coupled to the first and/or second microelectronic elements 736,753 but does not include an overmold 11.

In addition, the microelectronic assembly 700 may further include joining units 715 attached to terminals 710 on the second surface 706 of the substrate 702. The joining units 710 may be solder balls or other masses of bond and metal, e.g., tin, indium, or a combination thereof, and are adapted to join and electrically couple the microelectronic assembly 700 to a circuit panel, such as a printed circuit board.

Figure 12:
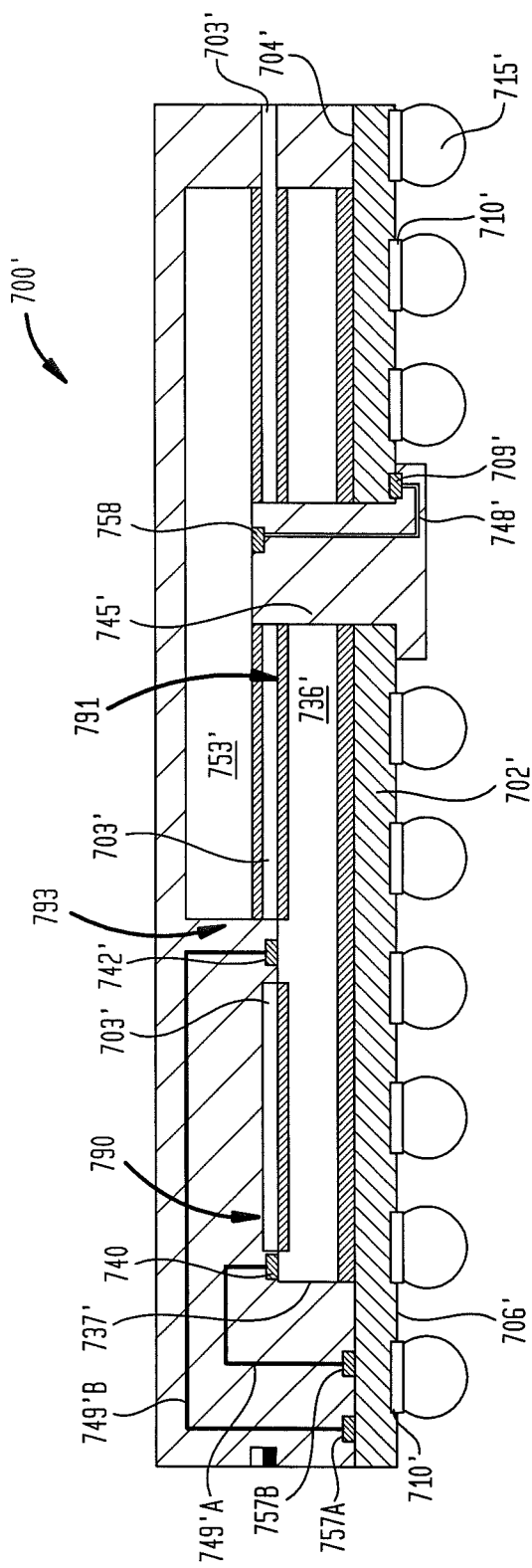
FIG. 12 is a cross-sectional view of a microelectronic package in accordance with another embodiment.

FIG. 12 depicts a variation of the microelectronic assembly 700 shown in FIG. 11. In this variation, the first microelectronic element 736' may be positioned so that the surface 740' is a front surface facing away from the substrate 702'. Surface 740' may have a first end portion 790 adjacent the first edge 737' of the first microelectronic element 736', a second end portion 791 adjacent the second edge 745', and a central portion 793 between the first and second end portions 790 and 791. The bond pads or contacts 742' may be disposed within the first end portion 790 of the surface 740' adjacent the first edge 737', within the central portion 793 of the surface 740', or within both the first end portion 790 and central portion 793. In one embodiment, the contacts 742' may be arranged in one or two parallel rows at the central portion 793 of the surface 740'.

The microelectronic assembly 700' can further include leads 749' electrically connected with the contacts 742' at the surface 740' and with the terminals 710'. In one example, portions of the leads 749' such as wire bonds can extend beyond the first edge 737' of the first microelectronic element 736' to contacts 757A, 757B, which in turn, can be connected to terminals 710', such as through traces (not shown) or other conductive elements. The leads 749B' may include wire bonds extending from the contacts 742', beyond the first edge 737' of the first microelectronic element 736', and to contacts 757A at the first surface 704' of the substrate 702', and may include other conductive structure of the substrate such as conductive traces between the contacts and the terminals 710'. As shown in FIG. 12B, lead portions 748', e.g., wire bonds can connect contacts 758 of microelectronic element 753' to contacts 709' adjacent the aperture 716'.

A heat spreader 703' may be positioned between the first microelectronic element and the second microelectronic element 753'. In this embodiment, the heat spreader will have openings to allow for the lead wires 749', 748' to extend therethrough.

Figure 13:
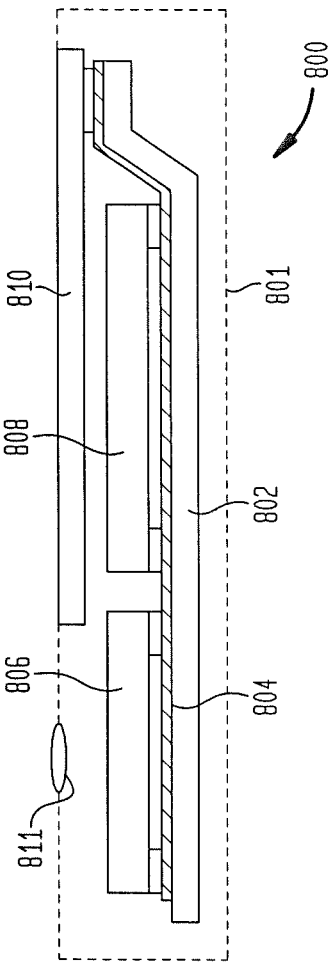
FIG. 13 is a cross-sectional view of a system in accordance with one embodiment.

The various microelectronic packages discussed above can be utilized in the construction of diverse electronic systems. For example, referring to FIG. 13, a system 800 in accordance with a further embodiment of the invention includes a structure 806 as described in the prior embodiments of microelectronic assemblies above in conjunction with other electronic components 808 and 810. In the example depicted, component 808 is a semiconductor chip whereas component 810 is a display screen, but any other components can be used. Of course, although only two additional components are depicted in FIG. 13, for clarity of illustration, the system may include any number of such components. The structure 806, as described above, may be, for example, a composite chip or a structure incorporating plural chips. In a further variant, both may be provided, and any number of such structures may be used. Structure 806 and components 808 and 810 are mounted in a common housing 801, schematically depicted in broken lines, and are electrically interconnected with one another as necessary to form the desired circuit. In the exemplary system shown, the system includes a circuit panel 802 such as a flexible printed circuit board, and the circuit panel includes numerous conductors 804, of which only one is depicted in FIG. 13, interconnecting the components with one another. However, this is merely exemplary; any suitable structure for making electrical connections can be used. The housing 801 is depicted as a portable housing of the type usable, for example, in a cellular telephone or personal digital assistant, and screen 810 is exposed at the surface of the housing. Where structure 706 includes a light-sensitive element such as an imaging chip, a lens 711 or other optical device also may be provided for routing light to the structure. Again, the simplified system shown in FIG. 13 is merely exemplary; other systems, including systems commonly regarded as fixed structures, such as desktop computers, routers, and the like, can be made using the structures discussed above. As used in this disclosure, terms such as "upper," "lower," "upwardly," and "downwardly," and similar terms denoting directions, refer to the frame of reference of the components themselves, rather than to the gravitational frame of reference. With the parts oriented in the gravitational frame of reference in the directions shown in the figures, with the top of the drawing being up and the bottom of the drawing being down in the gravitational frame of reference, the upper substrate is, indeed, above the lower substrate in the gravitational frame of reference. However, when the parts are turned over, with the top of the drawing facing downwardly in the gravitational frame of reference, the upper substrate is below the lower substrate in the gravitational frame of reference. Furthermore, the foregoing descriptions of the preferred embodiments are intended to illustrate, rather than to limit the present invention.

As these and other variations and combinations of the features discussed above can be utilized without departing from the present invention as defined by the claims, the foregoing description of the preferred embodiments should be taken by way of illustration rather than by way of limitation of the invention as defined by the claims. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
  a substrate having terminals thereon configured for electrical connection with a component external to the package;
  a first microelectronic element having a first face adjacent to and facing the substrate, a second face opposite the first face, and an edge extending between the first and second faces;
  a second microelectronic element having a face partially overlying and facing the second face of the first microelectronic element, a plurality of contacts on the face of the second microelectronic element being disposed beyond the edge of the first microelectronic element;

a sheet-like heat spreader separating the first and second microelectronic elements, the heat spreader having an aperture, a first surface facing the second microelectronic element and peripheral edges bounding the first surface;

connections extending through the aperture; and an overmold overlying the substrate and at least a portion of the first surface of the heat spreader, the overmold having a first overmold surface opposite the first surface of the heat spreader and peripheral edges extending away from the first overmold surface, wherein the heat spreader is exposed at at least one of the peripheral edges of the overmold, wherein the face of the second microelectronic element faces the heat spreader and is thermally coupled with the heat spreader, the contacts of the second microelectronic element are aligned with the aperture, and the terminals are electrically coupled together through the connections.

2. The microelectronic package of claim 1, further comprising a third microelectronic element having a first face adjacent to and facing the substrate and a second face opposite the first face, wherein the face of the second microelectronic element partially overlies the second face of the third microelectronic element.

3. The microelectronic package of claim 2, further comprising a fourth microelectronic element having a face partially overlying the second face of at least one of the first or third microelectronic elements and having contacts on the face of the fourth microelectronic element beyond at least one of the edge of the first microelectronic element or an edge of the third microelectronic element, wherein the heat spreader has a second aperture, the package having second connections extending through the second aperture and electrically coupling the fourth microelectronic element with the substrate.

4. The microelectronic package of claim 3, wherein the first and second apertures are parallel to one another in their longest dimensions.

5. The microelectronic package of claim 3, wherein the longest dimensions of the first and second apertures are normal to one another.

6. The microelectronic package as claimed in claim 5, wherein at least a portion of the heat spreader is in thermal contact with the first microelectronic element and not the second microelectronic element.

7. The microelectronic package as claimed in claim 5, wherein at least a portion of the heat spreader is in thermal contact with the second microelectronic element and not the first microelectronic element.

8. The microelectronic package as claimed in claim 1, wherein the substrate includes an opening extending between first and second opposed surfaces thereof, and the connections include leads having portions aligned with the opening of the substrate.

9. The microelectronic package as claimed in claim 8, wherein the leads are wire bonds extending through the opening of the substrate.

10. The microelectronic package as claimed in claim 8, wherein the substrate has a second opening extending between the first and second surfaces, the first face of the first microelectronic element facing the first surface of the substrate and having a plurality of contacts on the first face aligned with the second opening, the contacts of the first microelectronic element being electrically coupled with the terminals with leads having portions aligned with the second opening.

11. The microelectronic package as claimed in claim 10, wherein the leads include wire bonds extending through the second opening.

12. The microelectronic package as claimed in claim 1, wherein the heat spreader includes a metal foil.

13. The microelectronic package as claimed in claim 1, wherein the heat spreader extends beyond two of the peripheral edges of the overmold.

14. The microelectronic package as claimed in claim 1, wherein the heat spreader extends beyond four of the peripheral edges of the overmold.

15. The microelectronic package as claimed in claim 1, wherein at least one peripheral edge of the heat spreader is exposed at and flush with at least one of the peripheral edges of the overmold.

16. The microelectronic package as claimed in claim 1, wherein the heat spreader does not extend beyond the peripheral edges of the overmold.

17. The microelectronic package as claimed in claim 1, wherein at least a portion of the heat spreader is bent in a direction of the substrate.

18. The microelectronic package as claimed in claim 17, wherein the heat spreader is in thermal contact with the substrate.

19. The microelectronic package as claimed in claim 1, wherein at least a portion of the heat spreader is bent in a direction away from the substrate.

20. The microelectronic package as claimed in claim 1, wherein the heat spreader is in thermal communication with the first and second microelectronic elements.

21. The microelectronic package as claimed in claim 1, wherein the heat spreader is in thermal contact with a portion of at least one of the first or second microelectronic elements.

22. An assembly including the microelectronic package as claimed in claim 1 and a circuit panel, the microelectronic package being electrically interconnected with the circuit panel and the heat spreader being joined to the circuit panel.

23. The microelectronic package as claimed in claim 1, wherein the heat spreader extends along a plane between the first and second microelectronic elements, wherein the aperture includes an axis extending in a direction transverse to the plane, and wherein the contacts of the second microelectronic element overlie the axis of the aperture.

24. The microelectronic package of claim 1,
wherein the heat spreader further comprises a plurality of apertures,
wherein the microelectronic package further comprises a third microelectronic element having a face and a plurality of contacts on the face thereof, the face of the third microelectronic element facing the heat spreader, and
wherein the contacts of the third microelectronic element are aligned with one of the plurality of apertures.

25. The microelectronic package of claim 2, wherein the package further comprises a fourth microelectronic element having a first face overlying the heat spreader and a plurality of contacts on the first face thereof,
wherein the heat spreader further includes a second aperture, and
wherein the contacts on the first face of the fourth microelectronic element are aligned with the second aperture.

26. A microelectronic package, comprising:
a substrate having terminals thereon configured for electrical connection with a component external to the package, a first surface and substrate contacts at the first surface;
a first microelectronic element having a first face adjacent to and facing the first surface of the substrate, a second face opposite the first face, an edge extending between the first and second faces, and a plurality of contacts disposed at the first face, the plurality of contacts facing the substrate contacts and joined to the substrate contacts;

a second microelectronic element having a face partially overlying and facing the second face of the first microelectronic element, a plurality of contacts on the face of the second microelectronic element being disposed beyond the edge of the first microelectronic element;

a sheet-like heat spreader separating the first and second microelectronic elements, the heat spreader having an aperture; and connections extending through the aperture, wherein the face of the second microelectronic element faces the heat spreader and is thermally coupled with the heat spreader, the contacts of the second microelectronic element are aligned with the aperture, and the terminals are electrically coupled together through the connections.

27. The microelectronic package as claimed in claim 26, further comprising a third microelectronic element having a first face adjacent to and facing the substrate and a second face opposite the first face, wherein the face of the second microelectronic element partially overlies the second face of the third microelectronic element.

28. The microelectronic package as claimed in claim 27, further comprising a fourth microelectronic element having a face partially overlying the second face of at least one of the first or third microelectronic elements and having contacts on the face of the fourth microelectronic element beyond at least one of the edge of the first microelectronic element or an edge of the third microelectronic element, wherein the heat spreader has a second aperture, the package having second connections extending through the second aperture and electrically coupling the fourth microelectronic element with the substrate.

29. The microelectronic package as claimed in claim 28, wherein the first and second apertures are parallel to one another in their longest dimensions.

30. The microelectronic package as claimed in claim 28, wherein the longest dimensions of the first and second apertures are normal to one another.

31. The microelectronic package as claimed in claim 26, wherein the substrate includes an opening extending between first and second opposed surfaces thereof, and the connections include leads having portions aligned with the opening of the substrate.

32. The microelectronic package as claimed in claim 26, further comprising an overmold overlying the substrate and at least a portion of a first surface of the heat spreader, the overmold having a first overmold surface opposite the first surface of the heat spreader and peripheral edges extending away from the first overmold surface.

33. The microelectronic package as claimed in claim 32, wherein the heat spreader extends beyond two of the peripheral edges of the overmold.

34. The microelectronic package as claimed in claim 26, wherein at least a portion of the heat spreader is bent in a direction of the substrate.

35. The microelectronic package as claimed in claim 26, wherein at least a portion of the heat spreader is bent in a direction away from the substrate.

36. A microelectronic package, comprising:
a substrate having terminals thereon configured for electrical connection with a component external to the package, a first surface, and substrate contacts disposed at the first surface;

a first microelectronic element having a first face adjacent to and facing the first surface of the substrate, a second face opposite the first face, an edge extending between the first and second faces, and a plurality of contacts disposed on the second face of the first microelectronic element and electrically connected to corresponding substrate contacts on the first surface of the substrate;

a second microelectronic element having a face partially overlying and facing the second face of the first microelectronic element, a plurality of contacts on the face of the second microelectronic element being disposed beyond the edge of the first microelectronic element;

a sheet-like heat spreader separating the first and second microelectronic elements, the heat spreader having an aperture; and connections extending through the aperture, wherein the face of the second microelectronic element faces the heat spreader and is thermally coupled with the heat spreader, the contacts of the second microelectronic element are aligned with the aperture, and the terminals are electrically coupled together through the connections.

37. The microelectronic package as claimed in claim 36, further comprising a third microelectronic element having a first face adjacent to and facing the substrate and a second face opposite the first face, wherein the face of the second microelectronic element partially overlies the second face of the third microelectronic element.

38. The microelectronic package as claimed in claim 37, further comprising a fourth microelectronic element having a face partially overlying the second face of at least one of the first or third microelectronic elements and having contacts on the face of the fourth microelectronic element beyond at least one of the edge of the first microelectronic element or an edge of the third microelectronic element, wherein the heat spreader has a second aperture, the package having second connections extending through the second aperture and electrically coupling the fourth microelectronic element with the substrate.

39. The microelectronic package as claimed in claim 38, wherein the first and second apertures are parallel to one another in their longest dimensions.

40. The microelectronic package as claimed in claim 38, wherein the longest dimensions of the first and second apertures are normal to one another.

41. The microelectronic package as claimed in claim 36, wherein the substrate includes an opening extending between first and second opposed surfaces thereof, and the connections include leads having portions aligned with the opening of the substrate.

42. The microelectronic package as claimed in claim 36, further comprising an overmold overlying the substrate and at least a portion of a first surface of the heat spreader, the overmold having a first overmold surface opposite the first surface of the heat spreader and peripheral edges extending away from the first overmold surface.

43. The microelectronic package as claimed in claim 42, wherein the heat spreader extends beyond two of the peripheral edges of the overmold.

44. The microelectronic package as claimed in claim 42, wherein the heat spreader extends beyond four of the peripheral edges of the overmold.

45. The microelectronic package as claimed in claim 42, wherein at least one peripheral edge of the heat spreader is exposed at and flush with at least one of the peripheral edges of the overmold.

46. The microelectronic package as claimed in claim 42, wherein the heat spreader does not extend beyond the peripheral edges of the overmold.

47. The microelectronic package as claimed in claim 36, wherein at least a portion of the heat spreader is bent in a direction of the substrate.

48. The microelectronic package as claimed in claim 47, wherein the heat spreader is in thermal contact with the substrate.

49. The microelectronic package as claimed in claim 36, wherein at least a portion of the heat spreader is bent in a direction away from the substrate.

50. The microelectronic package as claimed in claim 36, wherein the electrical connections between the contacts of the first microelectronic element and the corresponding substrate contacts are wire bonds.

* * * * *